United States Patent
Kang

(10) Patent No.: US 6,829,155 B2
(45) Date of Patent: Dec. 7, 2004

(54) NONVOLATILE FERROELECTRIC MEMORY DEVICE

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,573

(22) Filed: Jun. 30, 2003

(65) Prior Publication Data

US 2004/0109340 A1 Jun. 10, 2004

(30) Foreign Application Priority Data

Dec. 9, 2002 (KR) .................................. 10-2002-0077826

(51) Int. Cl.⁷ .......................... G11C 11/22; G11C 11/24
(52) U.S. Cl. ..................... 365/145; 365/149; 365/233.5
(58) Field of Search ................. 365/145, 149, 365/189.05, 230.08, 233, 233.5

(56) References Cited

U.S. PATENT DOCUMENTS

| | | | |
|---|---|---|---|
| 6,067,244 A | 5/2000 | Ma et al. | |
| 6,301,145 B1 | 10/2001 | Nishihara | |
| 6,314,016 B1 | 11/2001 | Takasu | |
| 6,370,058 B1 * | 4/2002 | Fukumoto | 365/145 |
| 6,385,078 B2 * | 5/2002 | Jeon | 365/145 |
| 6,504,748 B2 * | 1/2003 | Choi et al. | 365/145 |
| 6,525,989 B2 * | 2/2003 | Mizugaki et al. | 365/233.5 |
| 6,590,829 B2 * | 7/2003 | Takeuchi | 365/233.5 |
| 6,661,698 B1 * | 12/2003 | Kang | 365/233.5 |

* cited by examiner

Primary Examiner—Trong Phan
(74) Attorney, Agent, or Firm—Heller Ehrman White and McAuliffe LLP

(57) ABSTRACT

The nonvolatile ferroelectric memory device comprises a plurality of cell array blocks; a plurality of drivers; and a plurality of decoders connected to the cell array blocks, respectively, wherein the decoder comprises a first sub-decoder for generating the decoding signal applied to the driver and a second sub-decoder for generating a signal selecting the driver. As a result, the nonvolatile ferroelectric memory device can reduce the area of the device and improve the driving speed.

26 Claims, 25 Drawing Sheets

NONVOLATILE FERROELECTRIC MEMORY DEVICE

BACKGROUND OF THE INVENTION

1. Field of the Invention

The present invention generally relates to a nonvolatile ferroelectric memory device more particularly, to a nonvolatile ferroelectric memory device configured to reduce the area of the device and improve the driving speed by seperating wordline/plateline decoders.

2. Description of the Background Art

Generally, a ferroelectric randaom access memory (hereinafter, referred to as 'FRAM') has attracted considerable attention as next generation memory device because it has a data processing speed as fast as a DRAM and conserves data even after the power is turned off.

The FRAM includes capacitors similar to the DRAM, but the capacitors are made of a ferroelectric substance for utilizing the characteristic of a high residual polarization of the ferroelectric substance in which data is not removed even after eliminating an electric field applied thereto.

FIG. 1 is a characteristic curve illustrating a hysteresis loop of a general ferroelectric substance.

As shown in FIG. 1, a polarization induced by an electric field does not vanish but keeps some strength ('d' or 'a' state) due to existence of a residual (or spontaneous) polarization even after the electric field is cleared.

These 'd' and 'a' states may be assigned to binary values of '1' and '0' for use as a memory cell.

FIG. 2 is a structural diagram illustrating a unit cell of the FRAM device.

As shown in FIG. 2, the unit cell of the conventional FRAM is provided with a bitline BL arranged in one direction and a wordline WL arranged in another direction vertical to the bitline BL. A plateline PL is arranged parallel to the wordline and spaced at a predetermined interval. The unit cell is also provided with a transistor T1 having a gate connected to an adjacent wordline WL and a source connected to an adjacent bitline BL, and a ferroelectric capacitor FC1 having the first terminal of the two terminals connected to the drain terminal of the transistor T1 and the second terminal of the two terminals connected to the plateline PL.

The data input/output operation of the conventional FRAM is now described as follows.

FIG. 3a is a timing diagram illustrating a write mode of the FRAM.

Referring to FIG. 3a, when a chip enable signal CEB applied externally transits from a high to low level, and then address is decoded, a corresponding wordline WL is enabled. In other words, a potential of the wordline WL transits from a low to high level, thereby selecting the cell. SEN is a sense amplifier enable signal.

While the wordline WL is maintained at a high level, a high level signal of a predetermined interval and a low level signal of a predetermined signal are applied to a corresponding plateline PL.

In order to write a logic value "1" or "0" in the selected cell, a data signal DIN of high or low level is applied to a corresponding bitline BL.

In other words, if a high level signal is applied to a bitline BL, and a low level signal is applied to a plateline PL in an interval where a high level signal is applied to a wordline WL, a logic value "1" is written in the ferroelectric capacitor FC1.

If a low level signal is applied to a bitline BL, and a high level signal is applied to a plateline PL, a logic value "0" is written in the ferroelectric capacitor FC1.

FIG. 3b is a timing diagram illustrating a read operation of the conventional nonvolatile ferroelectric memory device.

Referring to FIG. 3b, when a chip enable signal CEB externally transits from a high to low level, all bitlines are equalized to a low level by an equalization signal.

After each bitline is activated, an address is decoded and a corresponding wordline WL is enabled by the decoded address. As a result, a potential of the wordline WL is transited from a low to high level, thereby selecting a corresponding unit cell.

A high signal is applied to a plateline of the selected cell to destroy a data corresponding to the logic value "1" stored in the FRAM.

If the logic value "0" is stored in the FRAM, a corresponding data will not be destroyed.

The destroyed and non-destroyed data output different values, respectively, according to the above-described hysteresis loop characteristics. As a result, a sense amplifier senses logic values "1" or "0".

In other words, as shown in the hysteresis loop of FIG. 1, the state moves from 'd' to 'f' when the data is destroyed while the state moves from 'a' to 'f' when the data is not destroyed.

As a result, a sense amplifier enable signal SEN is activated after a predetermined time to enable the sense amplifier. Then, when the data is destroyed, the sense amplifier amplifies the data to output a logic value "0". DOUT refers to output data.

After the data is outputted from the sense amplifier, the data should be recovered into the original data. Accordingly, when a high signal is applied to the corresponding wordline WL, the plateline PL is disabled from "high" to "low".

As the storage capacity is increased, many peripheral circuits are required to embody a ferroelectric memory device. The above-described conventional nonvolatile ferroelectric memory device has a problem that the area is increased.

SUMMARY OF THE INVENTION

Accordingly, It is an object of the present invention to provide a ferroelectric memory device configured to reduce the area by separately disposing wordline/plateline decoders outside of a cell array block, and to improve the driving speed by driving each decoder separately.

It is the other object of the present invention to provide a ferroelectric memory device configured to reduce the area of wordline/plateline drivers by disposing each signal line in different layers.

It is another object of the present invention to provide a ferroelectric memory device configured to stabilize the state of an initial cell storage node.

In order to achieve the above-described objects, there is provided a nonvolatile ferroelectric memory device comprising:

a plurality of cell array blocks configured to include a plurality of ferroelectric memory cells;

a control circuit block having control circuits for reading/storing data from/to the ferroelectric memory cell;

a data bus configured to be disposed between the plurality of cell array blocks vertical to the control circuit block and to transmit data between the ferroelectric memory cell and the control circuit block;

a wordline decoder configured to select a wordline connected to the ferroelectric memory cell of the cell array block; and a plateline decoder configured to select a plateline connected to the ferroelectric memory cell of the cell array block, wherein the wordline decoder includes a plurality of first sub-wordline decoders and a plurality of second sub-wordline decoders disposed outside of each cell array block, wherein the plateline decoder includes a plurality of first sub-plateline decoders and a plurality of second sub-plateline decoders disposed outside of each cell array block.

There is also provided a nonvolatile ferroelectric memory device comprising:

a plurality of cell array blocks configured to include a plurality of ferroelectric memory cells;

a control circuit block having control circuits for storing data in the ferroelectric memory cell and reading the stored data;

a data bus configured to be disposed between the plurality of cell array blocks vertical to the control circuit block and transmit data between the ferroelectric memory cell and the control circuit block;

a wordline decoder configured to select a wordline connected to the ferroelectric memory cell of the cell array block; and a plateline decoder configured to select a plateline connected to the ferroelectric memory cell of the cell array block, wherein the wordline decoder comprises: a plurality of first sub-wordline decoders disposed in a direction corresponding to the data bus of each cell array block; and a second sub-wordline decoder shared by the plurality of cell array blocks and disposed in a direction vertical to the data bus, wherein the plateline decoder comprises a first sub-plateline decoder disposed in a direction corresponding to the data bus of each cell array block; and a second sub-plateline decoder shared by the plurality of cell array blocks and disposed in a direction vertical to the data bus.

There is also provided a nonvolatile ferroelectric memory device comprising:

a plurality of cell array blocks configured to include a plurality of ferroelectric memory cells; and a control circuit block including an address control circuit for storing data in the ferroelectric memory cell and reading the stored data, wherein the address control circuit comprises:

an address buffer for buffering an address pad signal inputted through an address pad in response to a clock enable signal;

an address latch for latching an output signal from the address buffer in response to an operation control signal; and an address transition detecting means for detecting a transition point of an output signal from the address latch in response to a clock enable signal.

BRIEF DESCRIPTION OF THE DRAWINGS

The present invention will be described in terms of several embodiments to illustrate its broad teachings. References are also made to the attached drawings.

DETAILED DESCRIPTION OF THE PREFERRED EMBODIMENTS

The present invention will be described in detail with reference to the accompanied drawings.

Figure 1:
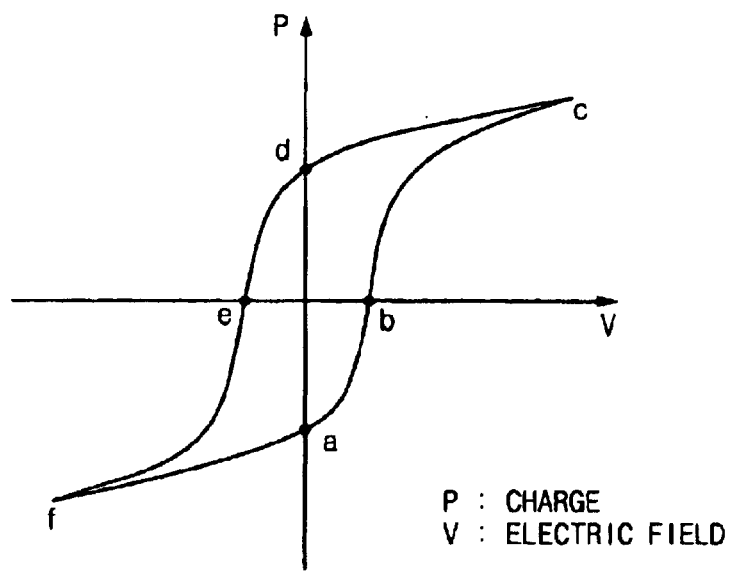
FIG. 1 is a characteristic curve illustrating a hysteresis loop of a general ferroelectric substance.
Figure 2:
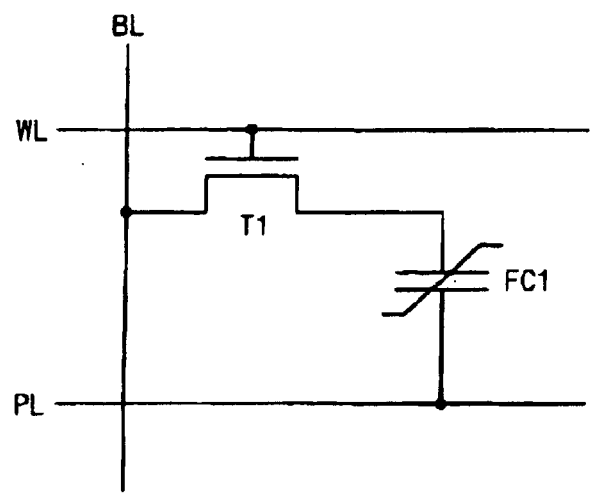
FIG. 2 is a circuit diagram illustrating a unit cell of a conventional nonvolatile ferroelectric memory device.
Figure 3A:
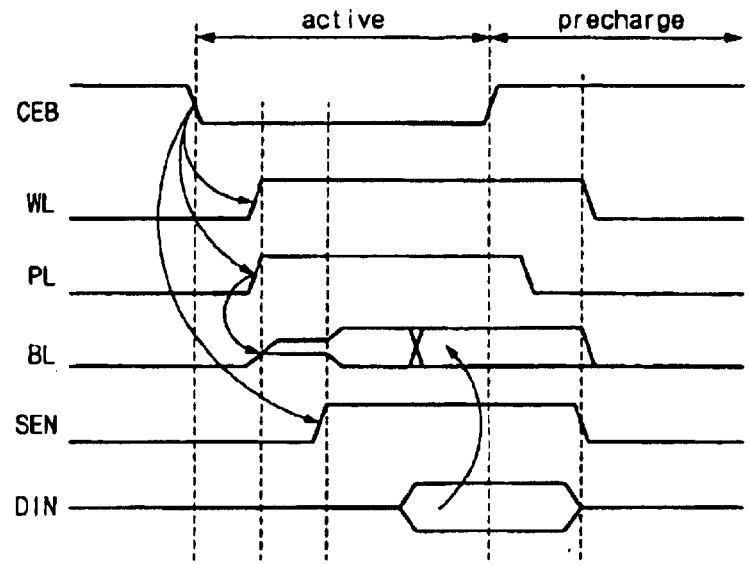
FIGS. 3a and 3b are timing diagrams illustrating operations of the conventional nonvolatile ferroelectric memory device.
Figure 3B:
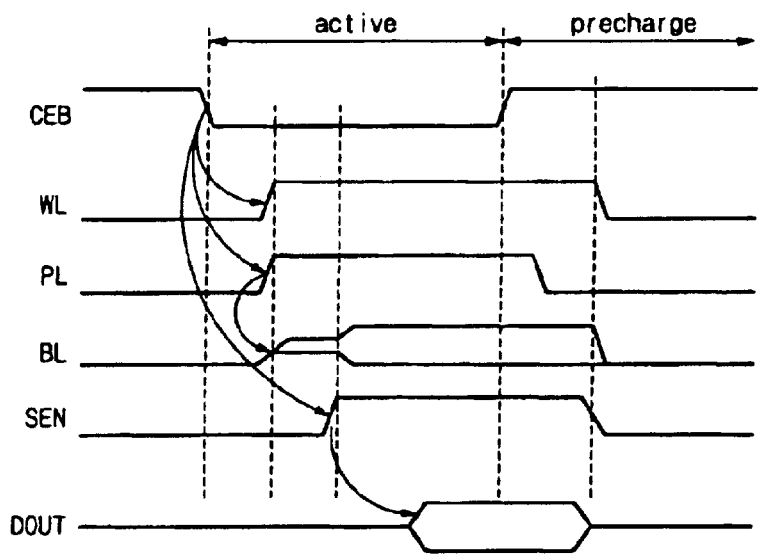
Figure 4:
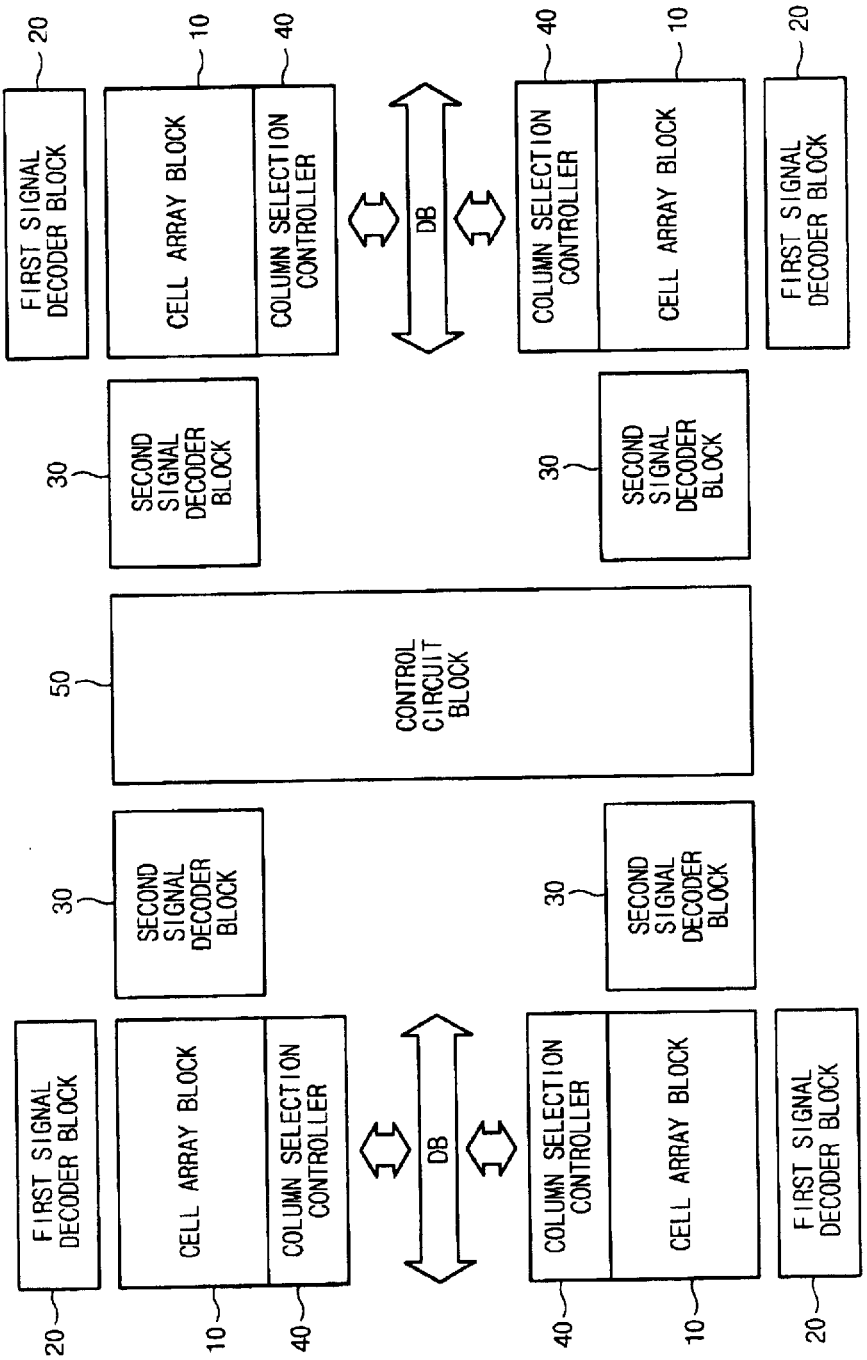
FIG. 4 is a block diagram illustrating a nonvolatile ferroelectric memory device according to the present invention.

FIG. 4 is a block diagram illustrating a nonvolatile ferroelectric memory device according to the present invention.

The disclosed nonvolatile ferroelectric memory device comprises a cell array block 10, a first signal decoder block 20, a second signal decoder 30, a column selecting control block 40, a control circuit block 50, and a data bus DB. The cell array block 10 includes a plurality of memory cells. The first and second decoder blocks 20 and 30 decode signals for controlling cell operations. The column selecting control block 40 selects a corresponding main bitline according to a column address. The control circuit block 50 includes control circuits such as control signal generating circuit, buffer, decoder and sense amplifier array. The data bus DB transmits data between the column selecting control block 40 and the control circuit block 50.

Here, the column selecting control block 40 is disposed between the cell array block 10 and the data bus DB. The cell array block is disposed between the first signal decoder block 20 and the column selecting control block 40. The second signal decoder block 30 is disposed between the cell array block 10 and the control circuit block 50. The first and second signal decoder blocks 20 and 30 are used to drive wordline WL/plateline PL.

Figure 5:
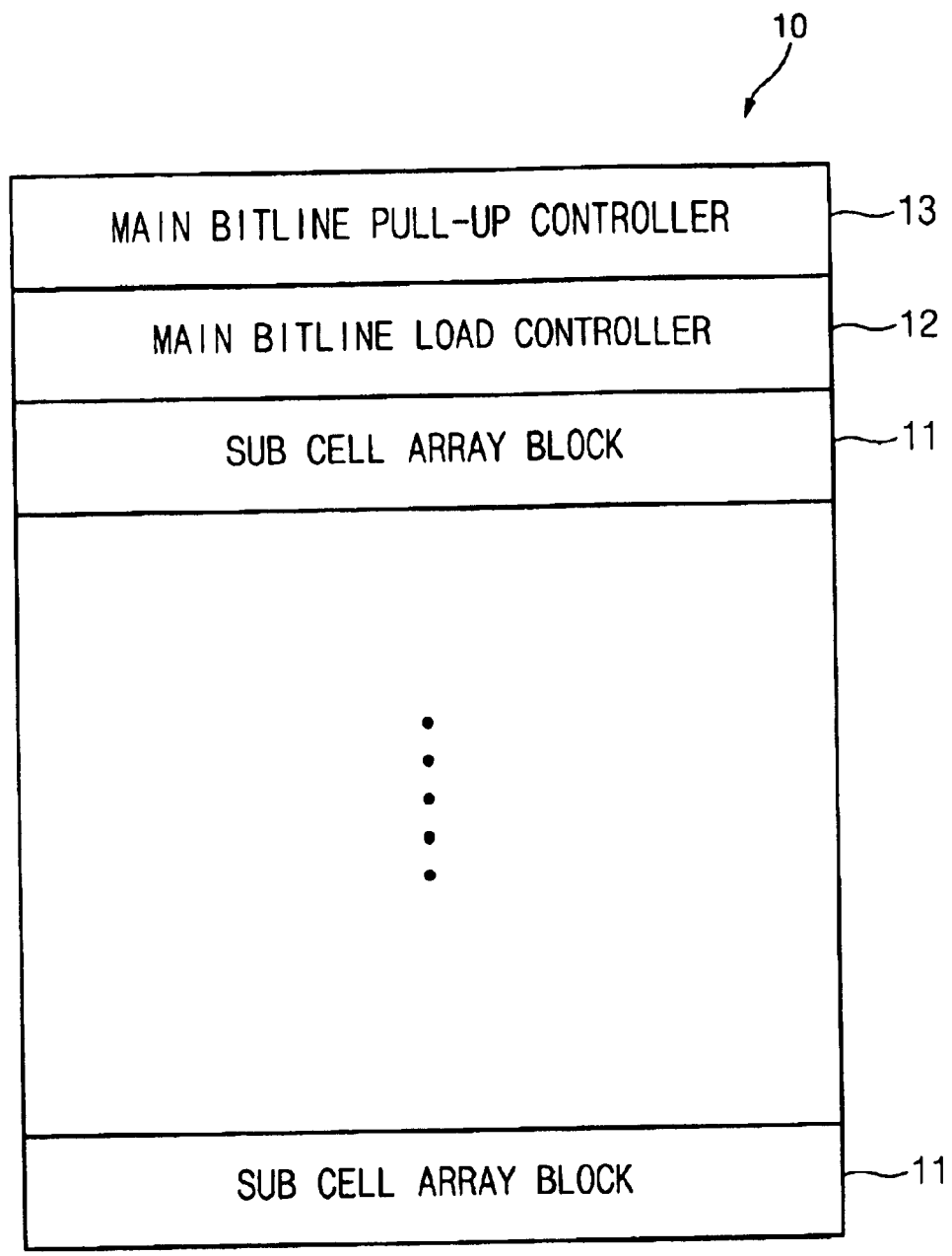
FIG. 5 is a block diagram illustrating a cell array block of FIG. 4.

FIG. 5 is a block diagram illustrating a cell array block of FIG. 4.

The cell array block 10 includes a plurality of sub-cell array blocks 11, a main bitline load controller 12, and a main bitline pull-up controller 13.

The main bitline load controller 12 serves as load in main biltlines. The main bitline pull-up contoller 13 pulls up the main bitlines.

Figure 6:
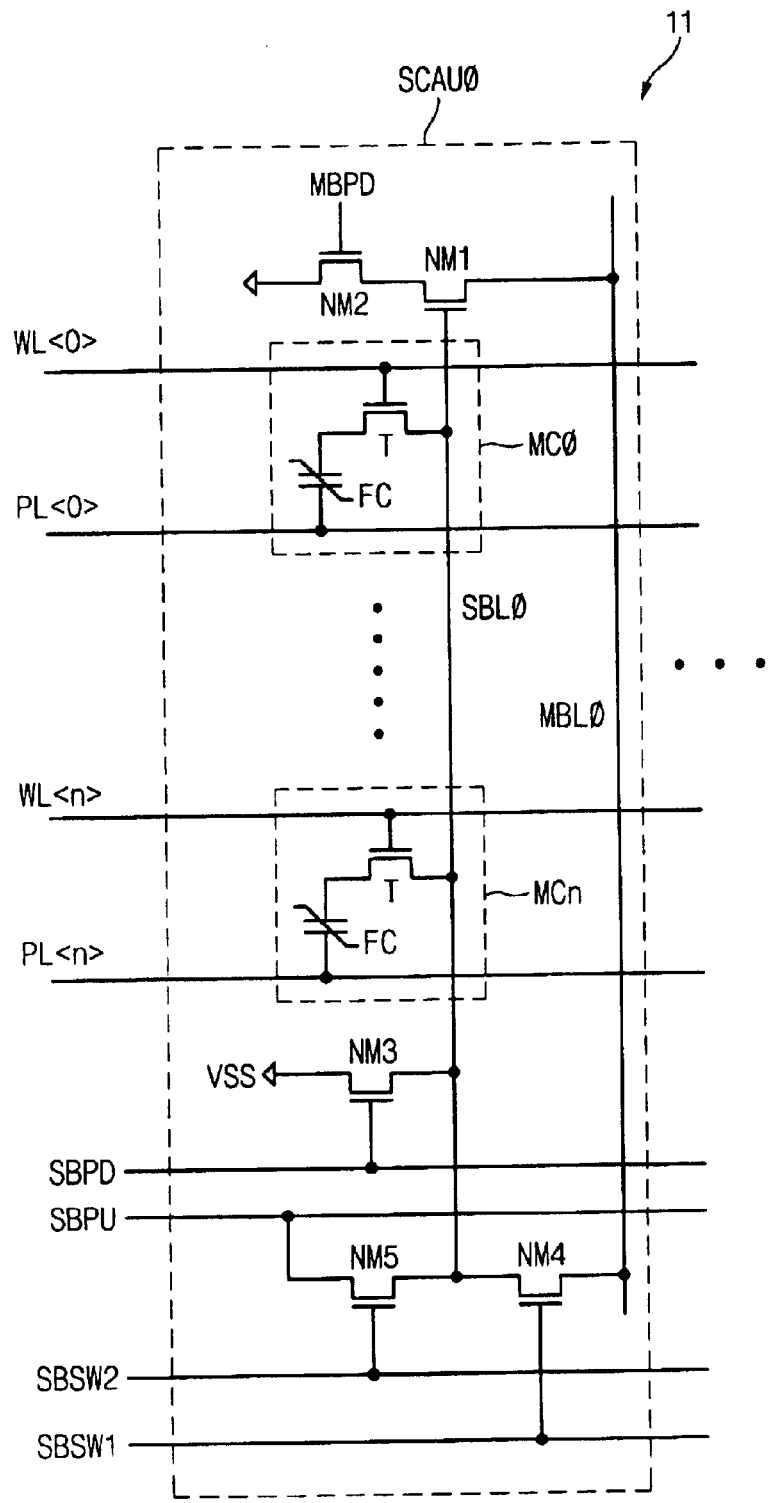
FIG. 6 is a circuit diagram illustrating a sub-cell array block of FIG. 5.

FIG. 6 is a circuit diagram illustrating a sub-cell array block of FIG. 5. Here, an example having an open bitline structure is described.

The sub-cell array block 11 includes a plurality of unit sub-cell array blocks SCAU0~SCAUn.

The unit sub-cell array block SCAU0 includes a plurality of unit cells MC0~MCn, and NMOS transistors NM1, NM2, NM3, NM4 and NM5. The each unit cells MC0~MCn is connected to wordlines WL0~WLn and platelines PL0~PLn. The plurality of unit cells MC0~MCn are connected to the same sub-bitline SBL0. The current regulating NMOS transistor NM1 connected in series between a main bitline MBL0 and a ground voltage VSS regulates a current of the main bitline MBL0 according to a voltage of the sub-bitline SBL0. The main bitline pull-down NMOS transistor NM2 transmits a current, which is transmitted from the NMOS transistor NM1, into the ground voltage VSS according to a main bitline pull-down signal MBPD. The pull-down NMOS transistor NM3 sets the sub-bitline SBL0 as the ground voltage VSS according to a sub-bitline pull-down signal SBPD. The switch NMOS transistor NM4 selectively transmits data in the main bitline MBL0O into the sub-bitline SBL0 according to a switch control signal SBSW1. The sub-bitline pull-up NMOS transistor NM5 pulls up to a potential of a sub-bitline pull-up signal SBPU.

Here, the rest unit sub-cell array blocks have the same structure as the above-described unit sub-cell array block SCAU0.

The main bitline MBL0 is connected to the sub-bitline SBL0 among the plurality of sub-bitlines SBL0~SBLn to one cell operation.

Figure 7:
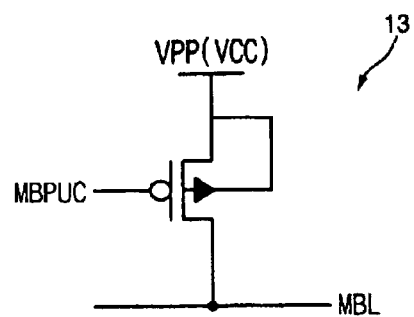
FIG. 7 is a circuit diagram illustrating a main bitline pull-up controller of FIG. 5.

The whole bitline load may be reduced to the load of the sub-bitline SBL0. FIG. 7 is a circuit diagram illustrating a main bitline pull-up controller of FIG. 5.

The main bitline pull-up controller 13 comprises a pull-up PMOS transistor which applies a boosting voltage VPP or a power voltage VCC to the main bitline according to a main bitline pull-up control signal MBPUC.

The PMOS transistor pulls up the main bitline MBL to the boosting voltage VPP or the power voltage VCC for a precharge operation.

Figure 8:
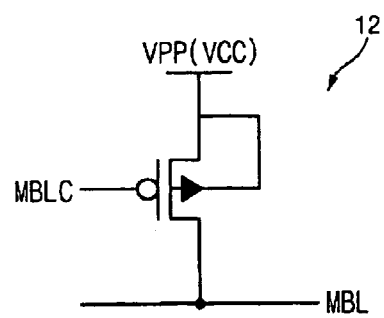
FIG. 8 is a circuit diagram illustrating a main bitline load controller of FIG. 5.

FIG. 8 is a circuit diagram illustrating a main bitline load controller of FIG. 5.

The main bitline load controller 12 comprises a load PMOS transistor serving as load, that is, resistance connected between the boosting voltage VPP or the power voltage VCC and the main bitline MBL according to a main bitline control signal MBLC. If turned on, the PMOS transistor of the main bitline load controller 12 is driven as load such that a current, not a voltage, flows in the main bitline MBL.

Figure 9:
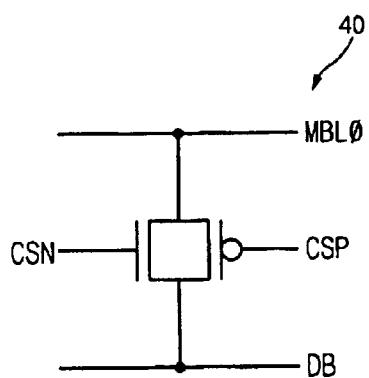
FIG. 9 is a circuit diagram illustrating a column selecting control block of FIG. 4.

FIG. 9 is a circuit diagram illustrating a column selecting control block of FIG. 4. Here, although an example where control circuits are connected to one main bitline MBL0 is illustrated, each control circuit is actually connected to a plurality of main bitlines.

The column selecting control block 40 comprises a plurality of control circuits including transmission gates. The transmission gate controlled by column selecting control signals CSN and CSP selectively transmits data between the main bitline MBL and the data bus DB.

Figure 10:
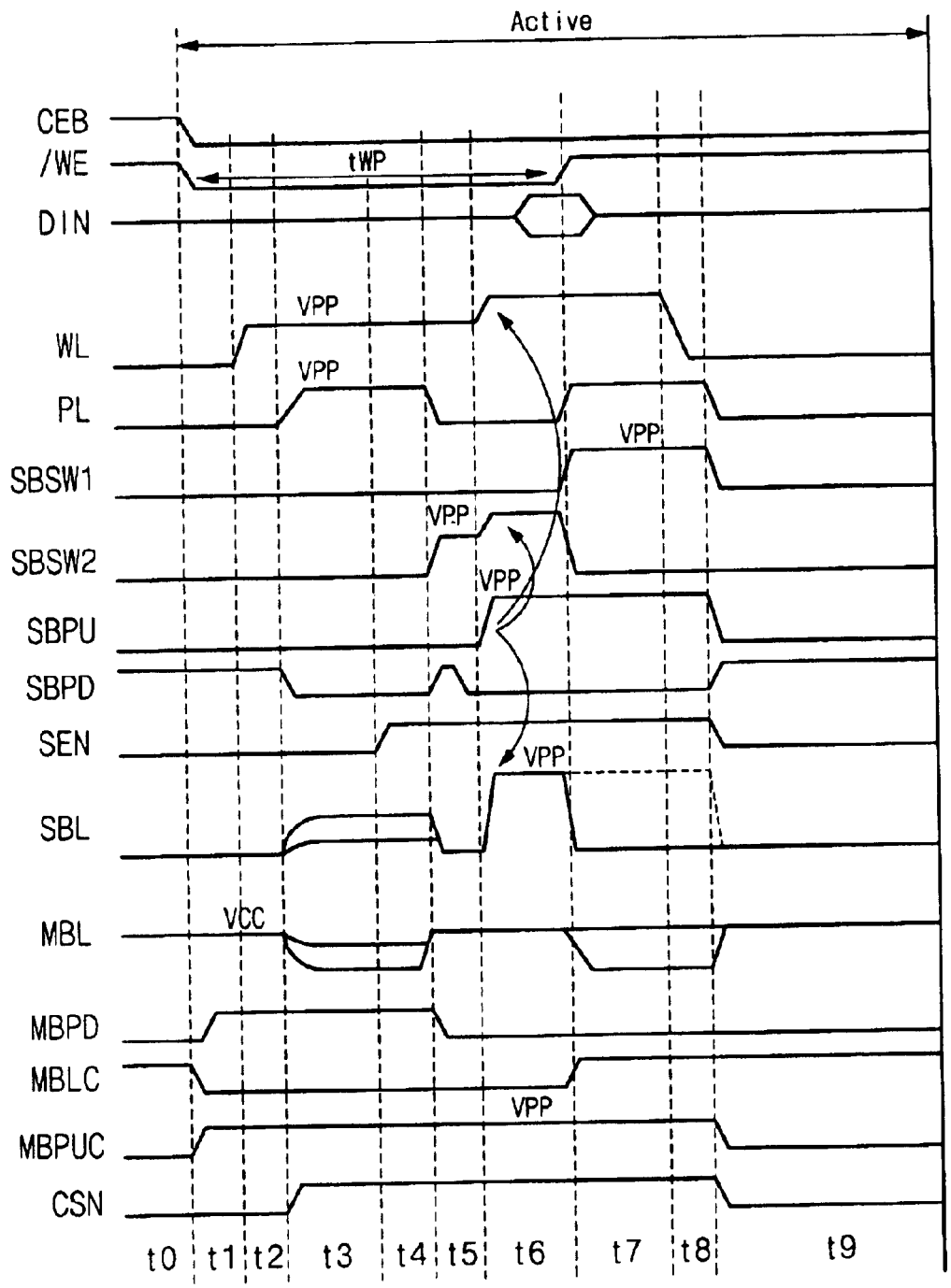
FIG. 10 is a timing diagram illustrating a write operation of the disclosed nonvolatile ferroelectric memory device.

FIG. 10 is a timing diagram illustrating a write operation of the disclosed nonvolatile ferroelectric memory device according to the present invention.

First, the sub-bitline SBL is precharged to the ground voltage VSS, and the main bitline MBL is precharged to the power voltage VCC (t0, t1).

The boosting voltage VPP is applied to the wordline WL earlier than the plateline PL (t2), and then the boosting voltage VPP is applied to the plateline PL. As a result, data stored in the unit cell MC is transmitted into the sub-bitline SBL. CEB is a chip enable signal. /WE is a write enable signal and performs a write operation in a low level of tWP. As described above with respect to other figures, MBLC is a main bitline control signal, MBPUC is a main bitline pull-up control signal, and CSN is a column selecting control signal.

Here, the boosting voltage VPP is applied to the wordline WL earlier than the plateline PL in order to improve sensing margin by stabilizing the initial state of cell storage node. Since the sub-bitline pull-down signal SBPD is maintained at a high level during the interval t2 the cell storage node is initialized to a ground level.

Here, the level of the main bitline MBL is lowered to an extent of the level of the sub-bitline SBL since the main bitline pull-down signal MBPD is at a high level (t3).

When the level of the main bitline MBL is fully lowered, the sense amplifier enable signal SEN becomes at a high levelsuch that the sense amplifier amplifies data in the main bitline MBL(t4).

When data in the main bitline MBL is fully amplified, the sub-bitline pull-down signal SBPD becomes at a high levelsuch that the sub-bitline SBL is pulled down to the ground voltage VSS. The main bitline MBL is pulled up to the power voltage VCC because the main bitline pull-up signal MBPUC is maintained at the level of the boosting voltage VPP. Here, the level of the plateline PL is transited to the ground voltage VSS(t5).

While the sub-bitline switch signal SBSW2 is maintained at the boosting voltage VPP, if the sub-bitline pull-up signal SBPU is transited to the level of the boosting voltage VPP, the level of the sub-bitline switch signal SBSW2 is boosted to a higher voltage than the boosting voltage VPP due to a self-boosting effect. As a result, the level of the sub-bitline SBL rises to that of the boosting voltage VPP.

In addition, while the wordline WL is maintained at the level of the boosting voltage VPP, the level of the sub-bitline SBL becomes at the level of the boosting voltage VPPsuch that the voltage level of the wordline WL is boosted to a higher voltage than the boosting voltage VPP due to the self-boosting effect. As a result, while the plateline PL is maintained at the level of the ground voltage VSS, the boosting voltage VPP is stored in the capacitor FC of every unit cell MC because the wordline WL is boosted to the higher voltage than the boosting voltage VPP (hidden "1(VPP)" write) (t6).

Thereafter, if data DIN is inputted, the main bitline MBL becomes a voltage level corresponding to the inputted data DIN. The sub-bitline switch signal SBSW1 is transited to the boosting voltage VPP such that the sub-bitline SBL has the same voltage level by the voltage level in the main bitline MBL. As a result, the voltage level corresponding to the inputted data is stored in the capacitor FC of the unit cell MC (write operation) (t7). Here, the rest memory cells MC, which are not selected, restore the previously read data (restore operation).

After completion of the restore operation, the wordline WL is deactivated to the ground level earlier than the plateline PL (t8), thereby stabilizing the cell storage node.

Then, the sub-bitline SBL is precharged to the ground voltage VSS, and the main bitline MB1 is precharged to the power voltage VCC (t9).

Figure 11:
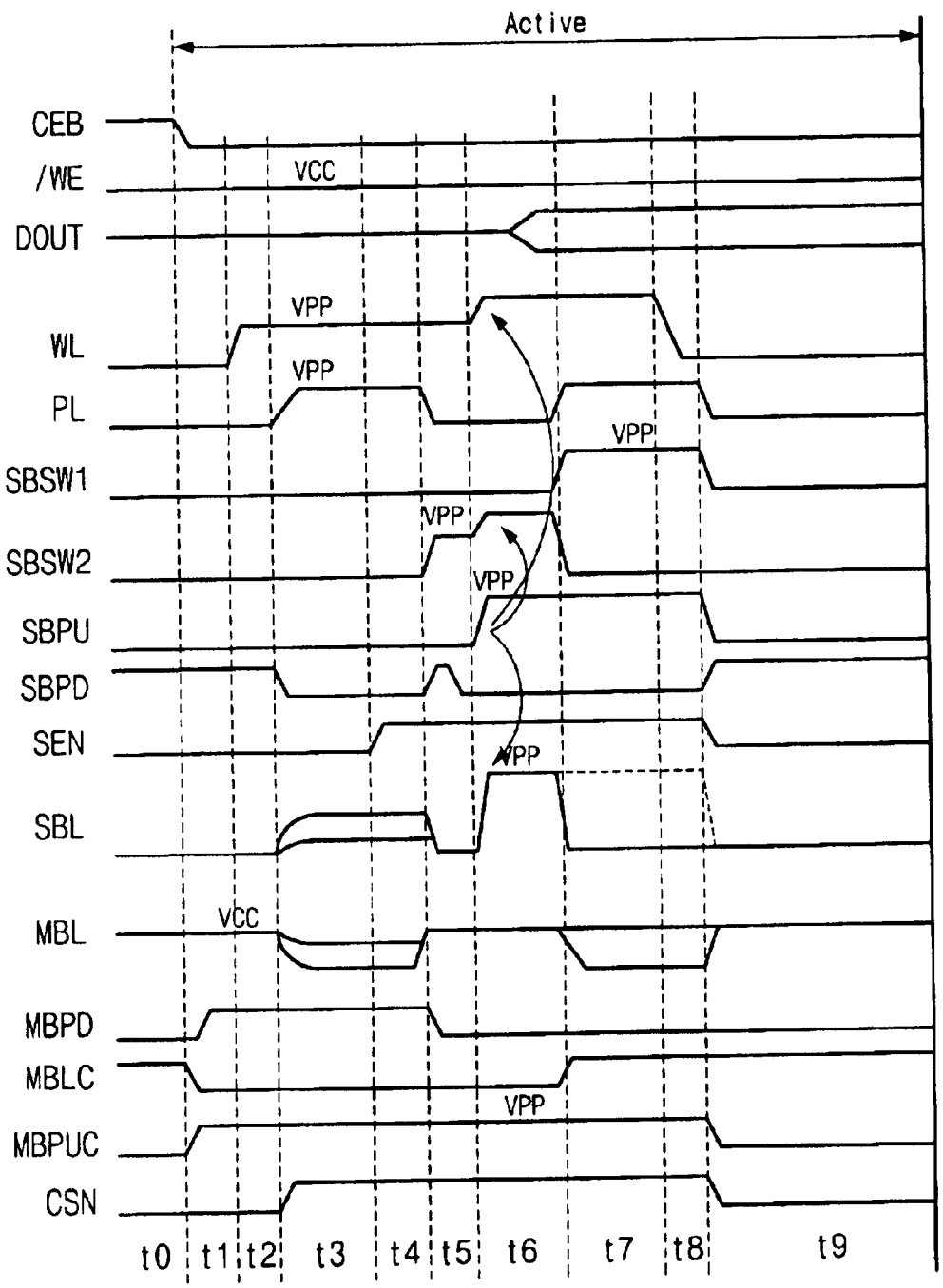
FIG. 11 is a timing diagram illustrating a read operation of the disclosed nonvolatile ferroelectric memory device.

FIG. 11 is a timing diagram illustrating a read operation of the disclosed nonvolatile ferroelectric memory device according to the present invention. As described above with respect to other figures, CEB is a chip enable signal, /WE is a write enable signal and performs a write operation in a low level of tWP, DOUT refers to output data, MBLC is a main bitline control signal, MBPUC is a main bitline pull-up control signal, and CSN is a column selecting control signal.

First, the sub-bitline SBL is precharged to the ground voltage VSS, and the main bitline MBL is precharged to the power voltage VCC (t0, t1).

The boosting voltage VPP is applied to the wordline WL earlier than the plateline PL (t2), and then the boosting voltage VPP is applied to the plateline PL. As a result, data stored in the unit cell MC is transmitted into the sub-bitline SBL.

Here, the boosting voltage is applied to the wordline WL earlier than the plateline PL in order to improve the sensing margin by stabilizing the initial state of cell storage node. Since the sub-bitline pull-down signal SBPD is maintained at a high level during an interval t2, the cell storage node is initialized to the ground level.

The level of the main bitline MBL is lowered to the voltage level of the sub-bitline SBL because the main bitline pull-down signal MBPD is at a high level (t3).

When the level of the main bitline MBL is fully lowered, the sense amplifier enable signal SEN becomes at a high level such that the sense amplifier amplifies data in the main bitline MBL (t4).

When data in the main bitline MBL is fully amplified, the data is outputted via an input/output bus IO.

After the data in the main bitline MBL is fully amplified, the sub-bitline pull-down signal SBPD becomes at a high level such that the sub-bitline SBL is pulled down to the ground voltage VSS. The main bitline MBL is pulled up to the power voltage VCC because the main bitline pull-up signal MBPUC is maintained at the level of the boosting voltage VPP. Here, the plateline PL is transited to the ground voltage VSS (t5).

While the sub-bitline switch signal SBSW2 is maintained at the level of the boosting voltage VPP, if the sub-bitline pull-up signal SBPU is transited to the level of the boosting voltage VPP, the level of the sub-switch signal SBSW2 is boosted to a higher voltage than the boosting voltage VPP due to the self-boosting effect. As a result, the level of the sub-bitline rises to that of the boosting voltage VPP.

In addition, while the wordline WL is maintained at the level of the boosting voltage VPP, the level of the sub-bitline SBL becomes at the level of the boosting voltage VPP such thatthe voltage level of the wordline WL is boosted to a higher voltage than the boosting voltage VPP due to the self-boosting effect. As a result, while the plateline PL is maintained at the level of the ground voltage VSS, the boosting voltage VPP is stored in the capacitor FC of every unit memory cell MC because the wordline WL is boosted to the higher voltage than the boosting voltage VPP (hidden "1"(VPP) write) (t6).

Thereafter, since data stored in the memory cells MC which are not selected are amplified by the sense amplifier and then latched, the main bitline MBL becomes at a voltage level corresponding to the data stored in each memory cell MC. The sub-bitline switch signal SBSW1 is transited to the boosting voltage VPP. The sub-bitline SBL becomes the same voltage level by the voltage level corresponding to the data in the main bitline MBL. As a result, the voltage level corresponding to the previously stored data is restored in the capacitor FC of the memory cell MC (t7).

After completion of the restoration operation, the wordline WL is deactivated to the ground level earlier than the plateline PL (t8), thereby stabilizing the cell storage node.

Thereafter, the sub-bitline SBL is precharged to the ground voltage VSS, and the main bitline MBL is precharged to the power voltage VCC (t9).

Figure 12:
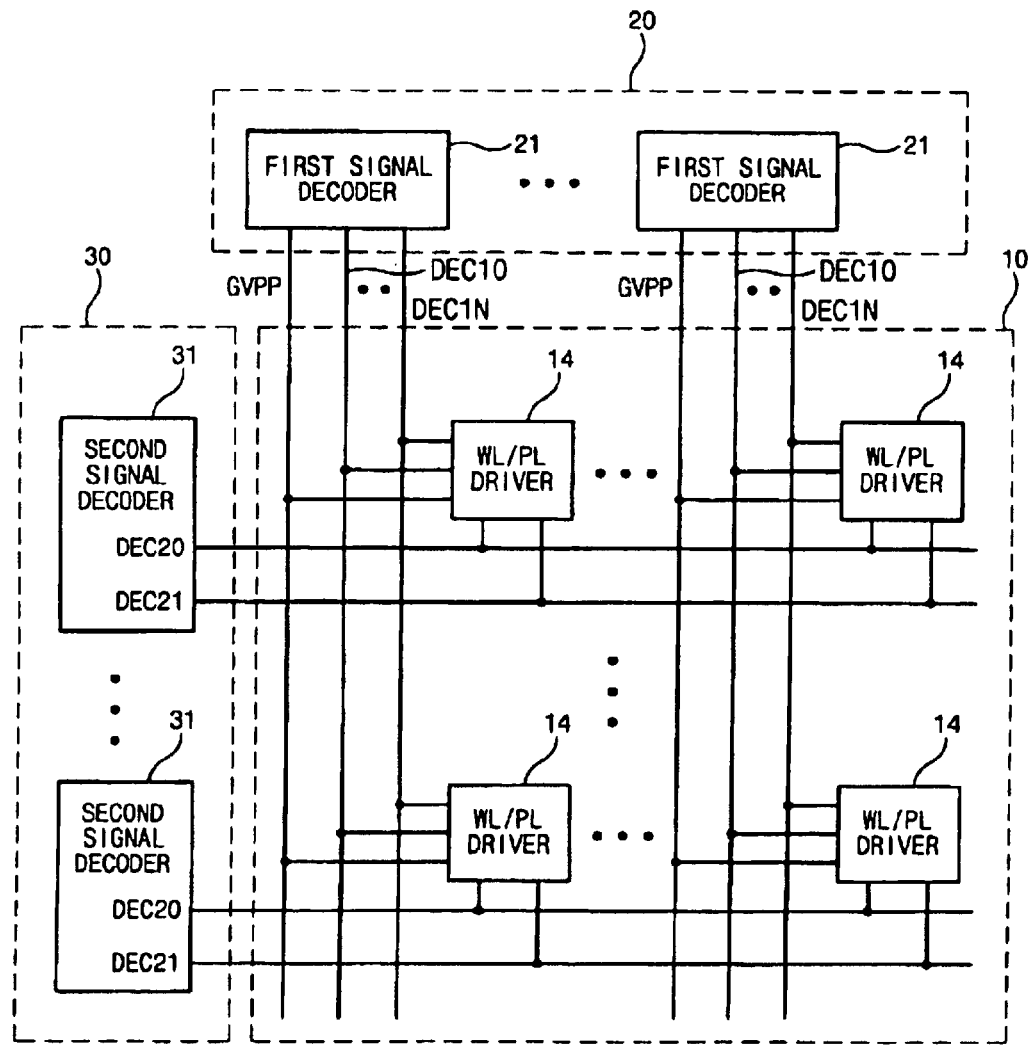
FIGS. 12 and 13 are block diagrams illustrating first and second signal decoder blocks of FIG. 4 and wordline WL/plateline PL driver.
Figure 13:
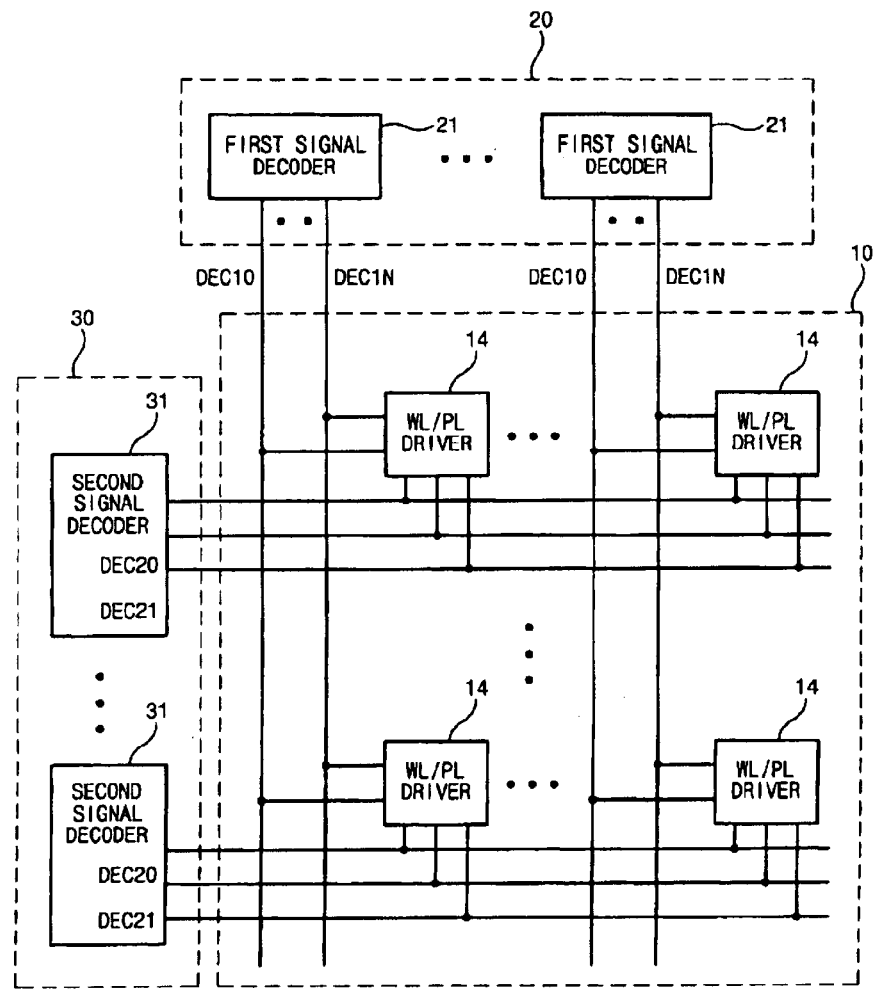

FIGS. 12 and 13 are block diagrams illustrating first and second signal decoder blocks and wordline WL/plateline PL driver of FIG. 4.

FIG. 12 shows an example wherein a gate boosting voltage GVPP is outputted from first signal decoders 210~21N of a first signal decoder block 20.

The first signal decoder block 20 includes a plurality of first signal decoders 210~21N. Each first signal decoder 210~21N outputs first decoder signals DEC10~DEC1N and the gate boosting voltage GVPP.

A second signal decoder block 30 includes a plurality of second signal decoders 310~31N. Each second signal decoder 310~31N outputs second decoder signals DEC30 and DEC21.

A wordline WL/plateline PL driver 14 is disposed in a region where buses of the first decoder signals DEC10~DEC1N and the gate boosting voltage GVPP are crossed with those of second decoder signals DEC20 and DEC21. FIG. 13 shows an example wherein the gate boosting voltage GVPP is outputted from second signal decoders 310~31N of a second signal decoder block 30.

A first signal decoder block 20 includes a plurality of first signal decoders 210~21N. Each first signal decoder 210~21N outputs first decoder signals DEC10~DEC1N.

A second decoder block 30 includes a plurality of second signal decoders 310~31N. Each second signal decoder 310~31N outputs second decoder signals DEC20 and DEC21, and the gate boosting voltage GVPP.

Figure 14:
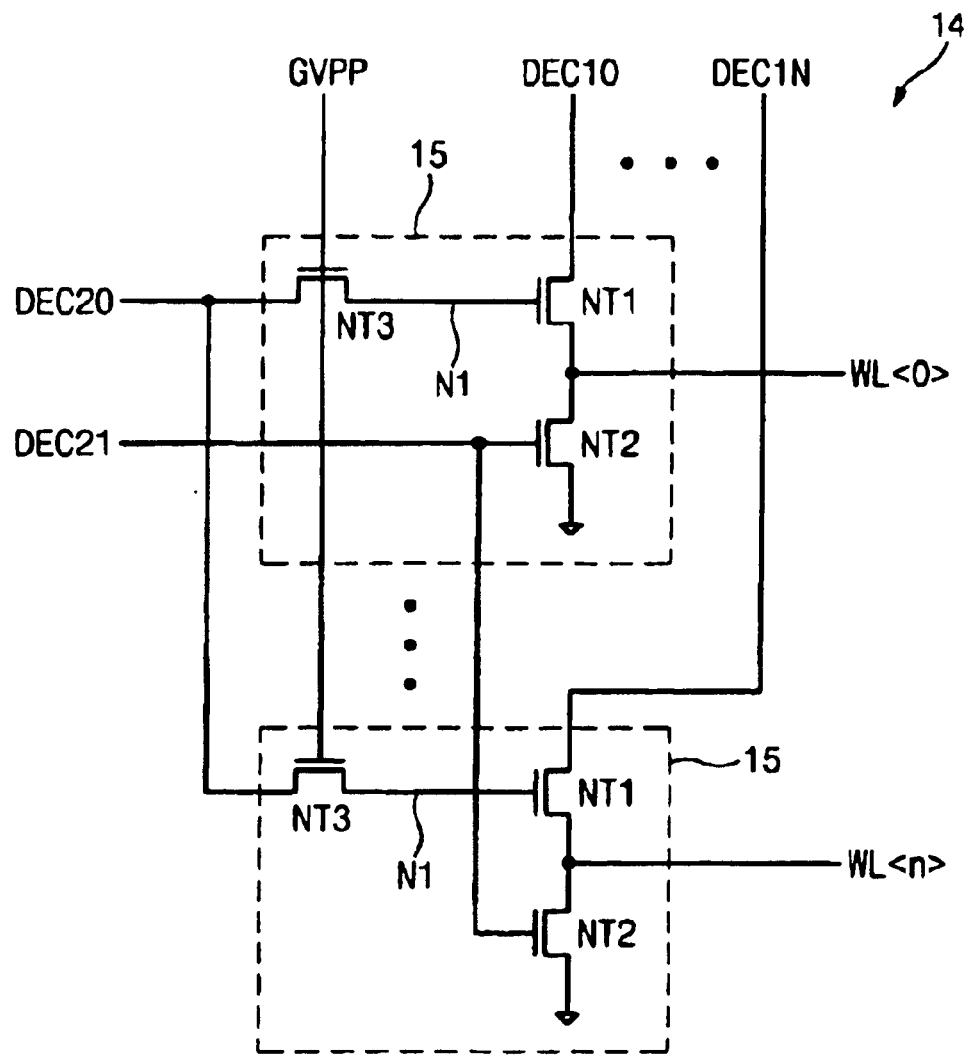
FIG. 14 is a circuit diagram illustrating an example of the wordline WL/plateline PL driver of FIGS. 12 and 13.

A wordline WL/plateline PL driver 14 is disposed in a region where buses of the first decoder signals DEC10~DEC1N and the gate boosting voltage GVPP cross with those of second decoder signals DEC20 and DEC21. FIG. 14 is a circuit diagram illustrating awordline driver of the wordline WL/plateline PL drivers 14 of FIGS. 12 and 13.

The wordline driver 14 includes unit wordline drivers 150~15N. Each unit wordline driver 150~15N comprises NMOS transistors NT1, NT2 and NT3. The NMOS transistor NT1 selectively applies first decoder signals DEC10~DEC1N to corresponding wordlines WL0~WLN according to a potential of a node N1. The NMOS transistor NT2 pulls down corresponding wordlines WL0~WLN according to a second decoder signal DEC21. The NMOS transistor NT3 selectively transmits a second decoder signal DEC20 according to the gate boosting voltage GVPP.

Figure 15:
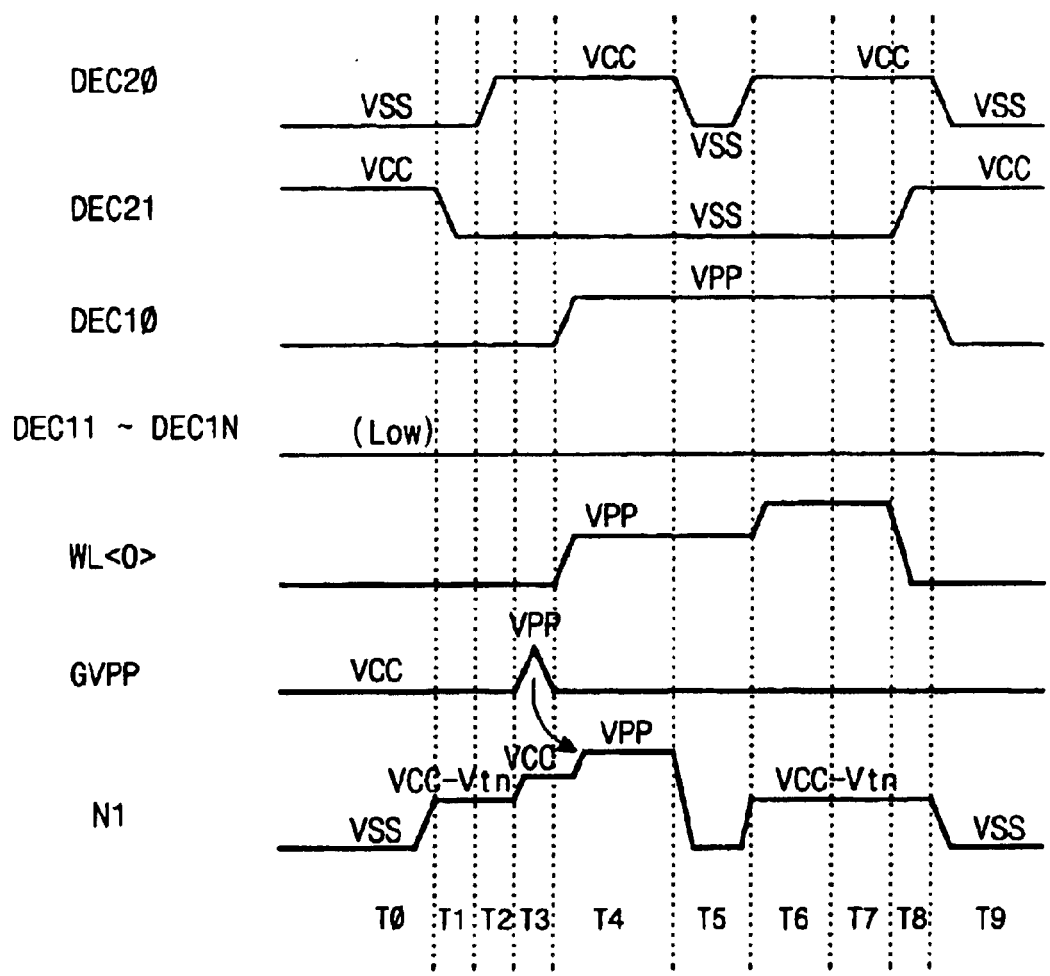
FIG. 15 is a timing diagram illustrating an operation of the wordline driver.

FIG. 15 is a timing diagram illustrating an operation of the wordline driver of FIG. 14. DEC10 is a first signal of the first decoder signal. DEC20 is a first signal of the second decoder signal.

Initially, the gate boosting voltage GVPP is maintained at the level of the power voltage VCC such that the NMOS transistor NT3 is maintained at a turn-on state.

Since the second decoder signal DEC20 is maintained at the ground voltage VSS, the node N1 is set as the ground voltage VSS. As a result, the NMOS transistor NT1 is turned off.

Here, the second decoder signal DEC21 is maintained at the power voltage VCC such that the NMOS transistor NT2 is turned on. As a result, the wordline WL is pulled down to the ground voltage VSS (t0).

The second decoder signal DEC20 is transited from the ground voltage to the power voltage VCC such that the node N1 is set as a voltage level VCC-Vtn (t1). Here, Vtn is a threshold voltage of the NMOS transistor NT3.

The second decoder signal DEC21 is transited from the power voltage VCC to the ground voltage VSS such that the NMOS transistor NT2 is turned off (t2).

The gate boosting voltage GVPP becomes at the level of the boosting voltage VPP such that the node N1 is boosted to the level of the power voltage VCC (t3).

Here, the first decoder signal DEC10 is transited to the level of the boosting voltage VPP such that the node N1 precharged to the power voltage rises to the boosting voltage VPP due to the self-boosting effect.

As a result, the voltage level of the wordline WL is boosted to the level of the boosting voltage VPP (t4).

Thereafter, the second decoder signal DEC20 is transited to the level of the ground voltage VSS such that the node N1 is transited to the level of the ground voltage VSS. As a result, the wordline WL becomes at a floating state to the level of the boosting voltage VPP (t5).

Here, the sub-bitline pull-up signal SBPU becomes at the level of the boosting voltage VPP such that the voltage level of the wordline WL is boosted to a higher voltage than the boosting voltage VPP due to the self-boosting effect (t6, t7).

Thereafter, the second decoder signal DEC21 is transited to the level of the power voltage VCC such that the NMOS transistor NT2 is turned on. As a result, the wordline WL is pulled down to the level of the ground voltage VSS (t8).

Lastly, the second decoder signal DEC20 and the corresponding first decoder signal DEC10 are transited to the ground voltage VSS. That is, the signals DEC20 and DEC10 are reset to their initial state (t9).

Figure 16:
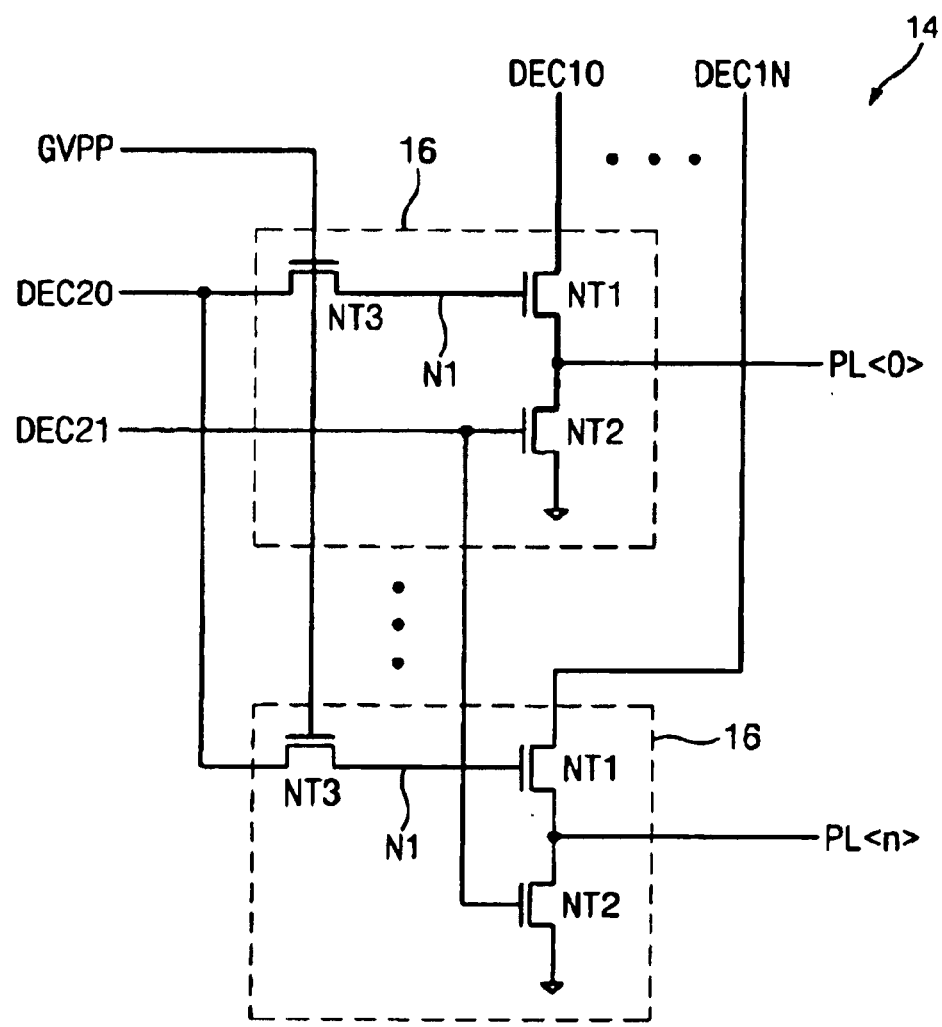
FIG. 16 is a circuit diagram illustrating another example of the wordline WL/plateline PL driver of FIGS. 12 and 13.

FIG. 16 is a circuit diagram illustrating a plateline driver of the wordline WL/plateline PL driver 14 of FIGS. 12 and 13.

The plateline driver 14 includes unit plateline drivers 160~16N. Each unit plateline driver 160~160N comprises NMOS transistors NT1, NT2 and NT3. The NMOS transistor NT1 selectively applies fist decoder signals DEC10~DEC1N to corresponding plateline PL0~PLN according to a potential of the node N1. The NMOS transistor NT2 pulls down the corresponding platelines PL0~PLN according to the second decoder signal DEC21. The NMOS transistor NT3 selectively transmits the second decoder signal DEC20 according to the gate boosting voltage GVPP.

Figure 17:
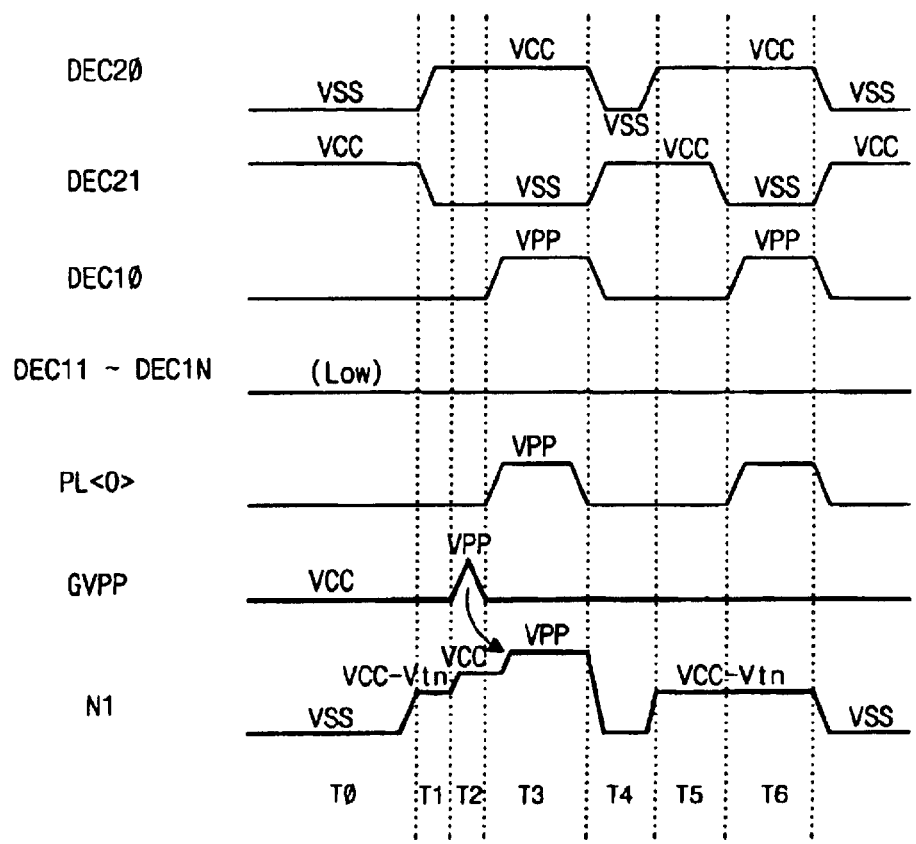
FIG. 17 is a timing diagram illustrating an operation of a plateline driver of FIG. 16.

FIG. 17 is a timing diagram illustrating an operation of a plateline driver of FIG. 16. DEC10 is a first signal of the first decoder signal. DEC20 is a first signal of the second decoder signal.

Initially, the gate boosting voltage GVPP is maintained at the power voltage VCC such that the NMOS transistor NT3 is maintained at a turn-on state.

Since the second decoder signal DEC20 maintained at the ground voltage VSS, the node N1 is set as the ground voltage VSS. As a result, the NMOS transistor NT1 is turned off.

Here, the second decoder signal DEC21 is maintained at the power voltage VCC such that the NMOS transistor NT2 is turned on. As a result, the plateline PL is pulled down to the ground voltage VSS (t0).

Thereafter, the second decoder signal DEC20 is transited from the ground voltage VSS to the power voltage VCC such thatthe node N1 is set as a voltage level VCC-Vtn (t1). Here, Vtn is a threshold voltage of the NMOS transistor NT3. The second decoder signal DEC21 is transited from the power voltage VCC to the ground voltage VSS such that the NMOS transistor NT2 is turned off (t1).

The gate boosting voltage GVPP becomes at a boosting voltage level VPP such that the node N1 is boosted to the power voltage level VCC (t2).

Here, the first decoder signal DEC10 is transited to the boosting voltage level VPP such that the node N1 precharged to the power voltage VCC rises to the boosting voltage VPP due to the self-boosting effect.

As a result, the voltage level of the plateline PL is boosted to the level of the boosting voltage VPP (t3).

The second decoder signal DEC20 is transited to the level of the ground voltage VSS such that the node N1 is transited to the level of the ground voltage VSS. As a result, the NMOS transistor NT1 is turned off.

The second decoder signal DEC21 is transited to the power voltage VCC such that the NMOS transistor NT2 is turned on. As a result, the plateline PL is pulled down to the level of the ground voltage VSS (t4).

Here, while the second decoder signal DEC21 is maintained at the level of the power voltage VCC, the NMOS transistor NT2 is maintained at a turn-on state. While the plateline PL0 is maintained at the level of the ground voltage VSS, the second decoder signal DEC20 is transited to the level of the power voltage VCC such that the NMOS transistor NT1 is turned on. However, since the first decoder signal DEC10 maintained at the level of the ground voltage VSS the plateline PL0 is maintained at the level of the ground voltage VSS (t5).

The second decoder signal DEC21 is transited to the level of the ground voltage VSS such that the NMOS transistor NT2 is turned off. While the second decoder signal DEC20 is maintained at the level of the power voltage VCC, the NMOS transistor NT1 is maintained at a turn-on state. While the NMOS transistor NT1 is maintained at a turn-on state, the first decoder signal DEC10 is transited to the level of the boosting voltage VPP such that the plateline PL0 is boosted to the level of the boosting voltage VPP (t6).

Thereafter, the second decoder signal DEC20 and the first decoder signal DEC10 are transited to the ground voltage VSS such that the node N1 becomes at the level of the ground voltage VSS. The second decoder signal dEC21 is transited to the level of the power voltage VCC such that the NMOS transistor NT2 is turned on. As a result, the plateline PL is pulled down to the level of the ground voltage VSS (t7).

Figure 18:
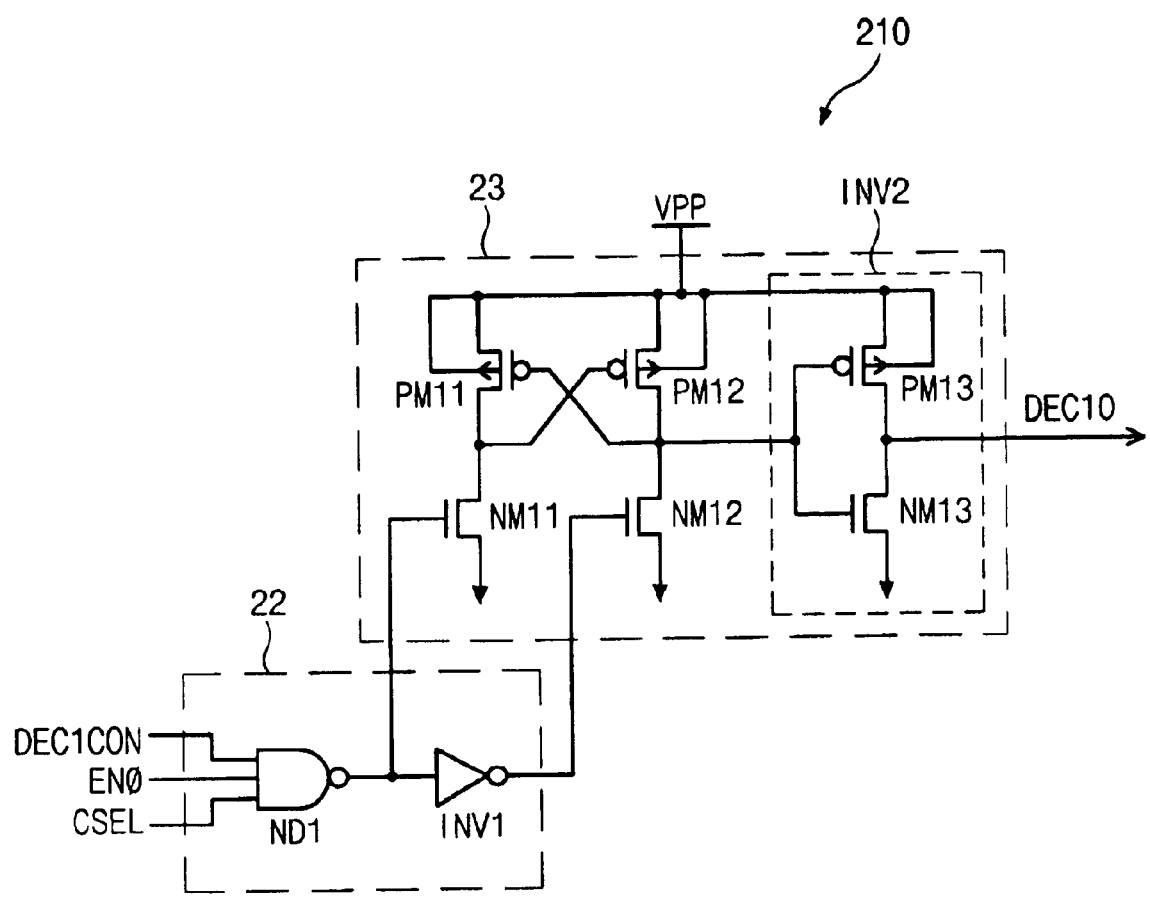
FIG. 18 is a circuit diagram illustrating one of a plurality of first signal decoders in a first signal decoder block of FIGS. 12 and 13.

FIG. 18 is a circuit diagram illustrating a first signal decoder of a first signal decoder block of FIGS. 12 and 13. Here, the rest of the plurality of first signal decoders have the same structure as that of the first signal decoder shown in FIG. 18.

The first signal decoder 210 comprises a decoding controller 22 and a level shifter 23. An output signal from the level shifter 23 becomes a first decoder signal DEC10.

The decoding controller 22 comprises a NAND gate ND1 and an inverter INV1. The NAND gate ND1 decodes an enable signal EN0 for selecting the corresponding first signal decoder 210, a timing control signal DEC1CON for determining timing of the first decoder signal DEC10, and a column selecting signal CSEL. The inverter INV1 inverts an output signal from the NAND gate ND1.

The level shifter 23 comprises PMOS transistors PM11 and PM12, NMOS transistors NM11 and NM12, and an inverter INV2. The PMOS transistors PM11 and PM12 are cross-coupled. The output signal from the NAND gate ND1 is applied to the NMOS transistors NM11, and the output signal from the inverter INV1 is applied to the NMOS transistor NM12. The inverter INV2 comprises a PMOS transistor PM13 and a NMOS transistor NM13 for inverting a potential of the common drain of the PMOS transistor PM12 and the NMOS transistor NM12 and outputting a first decoder signal DEC10.

Figure 19:
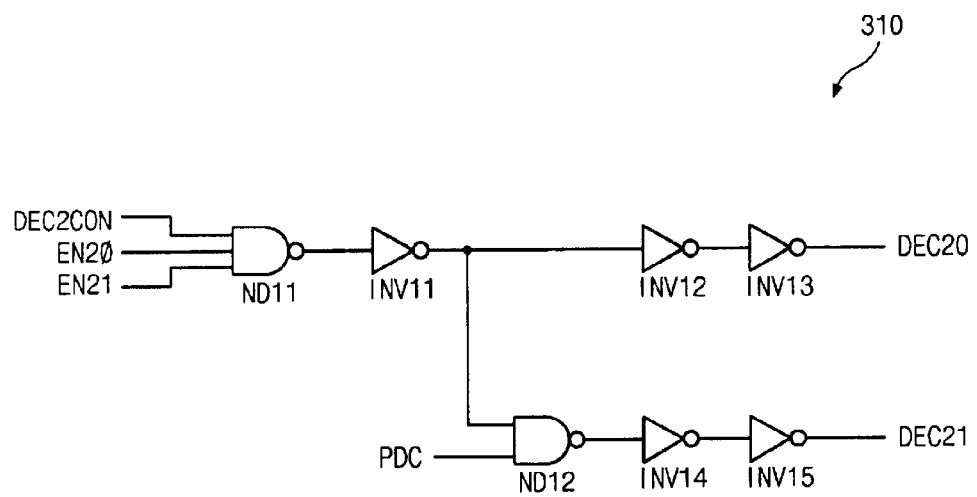
FIG. 19 is a circuit diagram illustrating one of a plurality of second signal decoders in a second signal decoder block of FIGS. 12 and 13.

FIG. 19 is a circuit diagram illustrating a second signal decoder of a second signal decoder block of FIGS. 12 and 13. Here, the plurality of the rest second signal decoders have the same structure as the second signal decoder shown in FIG. 19.

The second signal decoder 310 comprises NAND gates ND11 and ND12, and inverters INV11, INV12, INV13, INV14 and INV15. The NAND gate 11 decodes a timing control signal DEC2CON for determining timing of the second decoder signal DEC20, enable signals EN20 and EN21 for selecting the second signal decoder 310. The inverter INV11 inverts an output signal from the NAND gate ND1. The inverters INV12 and INV13 sequentially invert an output signal from the inverter INV11 to output the second decoder signal DEC20. The NAND gate ND12 NANDs an output signal from the inverter INV11 and a pull-down control signal PDC for determining a pull-down timing of the wordline WL and the plateline PL. The inverters INV14 and INV15 sequentially inverts an output signal from the NAND gate ND12 to output the second decoder signal DEC21.

Figure 20:
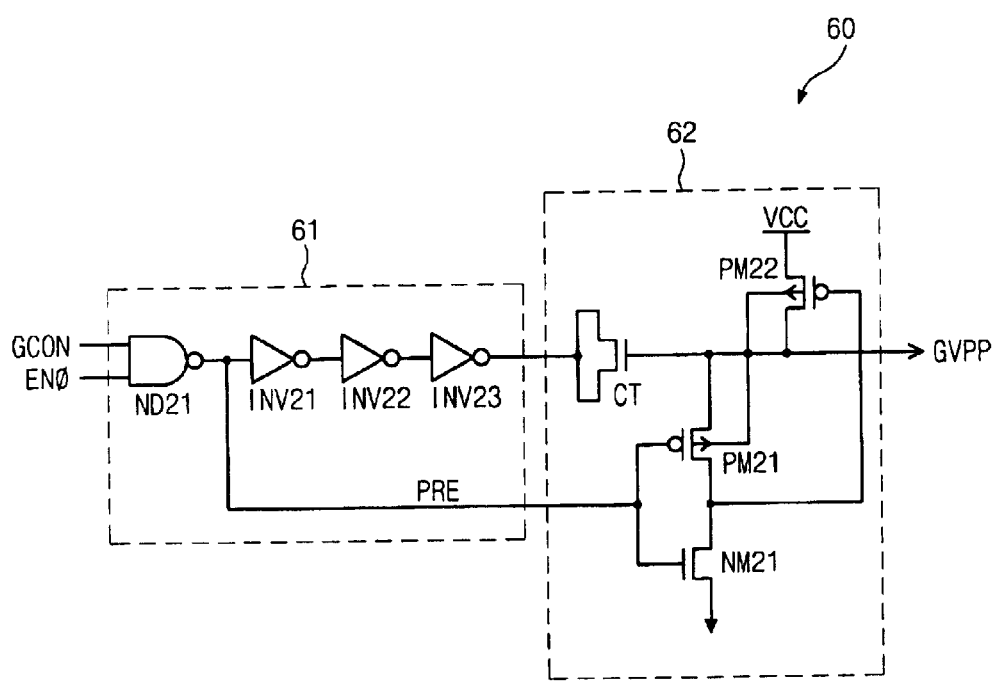
FIG. 20 is a circuit diagram illustrating a gate boosting voltage generator to generate a gate boosting voltage of FIGS. 12 and 13.

FIG. 20 is a circuit diagram illustrating a gate boosting voltage generator to generate a gate boosting voltage of FIGS. 12 and 13. FIG. 12 shows an example wherein the gate boosting voltage generator is included in each first signal decoder. FIG. 13 shows an example wherein the gate boosting voltage generator is included in each second signal decoder. Here, the same gate boosting voltage generator is used in the two examples of FIGS. 12 and 13. The rest of the plurality of the gate boosting voltage generators have the same structure as the gate boosting voltage generator of FIG. 20.

The gate boosting voltage generator 60 comprises a pump controller 61 and a pump unit 62.

The pump controller 61 includes an NAND gate ND21, and inverters INV21, INV22 and INV23. The NAND gate ND21 NANDs an enable signal EN0 for selecting the gate boosting voltage generator 60 and a timing control signal GCON for determining timing of the gate boosting voltage GVPP. The inverters INV21, INV22 and INV23 sequentially inverts an output signal PRE from the NAND gate to output a pump control signal PCON.

The pump unit 62 comprises PMOS transistors PM21 and PM22, a NMOS transistor NM21, and a pump capacitor CT. The PMOS transistor PM21 and the NMOS transistor NM21, connected in series between the output terminal and the ground voltage, have a common gate to receive the output signal PRE from the NAND gate ND21 of the pump controller 61. The PMOS transistor PM22 precharges an output terminal to the power voltage VCC according to a potential of the common drain of the PMOS transistor PM21 and the NMOS transistor NM21. The pump capacitor CT pumps the output terminal according to the pump control signal PCON.

Figure 21:
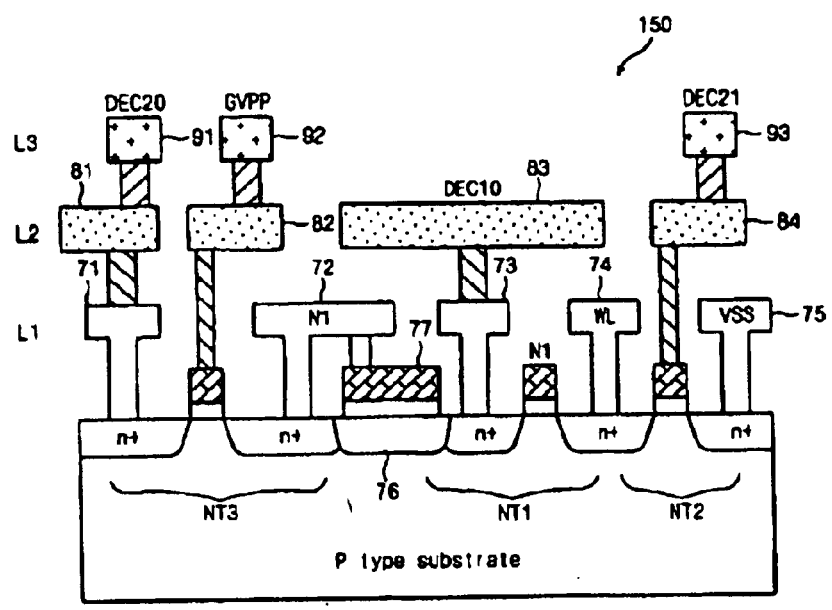
FIG. 21 is a cross-sectional diagram illustrating a layout of the wordline driver of FIG. 14.

FIG. 21 is a cross-sectional diagram illustrating a cross section diagram of the wordline driver of FIG. 14.

As shown in FIG. 21, signal lines are hierarchically formed into three layers L1, L2 and L3.

The signal lines 71, 72, 73, 74 and 75 are formed in the first layer L1. The signal line 71 applies the second decoder signal DEC20 to the drain terminal of the NMOS transistor NT3. The signal line 72 connects the gate terminal of the NMOS transistor NT1 to the source terminal of the NMOS transistor NT3. The signal line 73 applies the first decoder signal DEC10 to the drain terminal of the NMOS transistor NT1. The signal line 74 connects the wordline WL to the common connection terminal of the NMOS transistors NT1 and NT2. The signal line 75 connects the ground voltage line VSS to the source terminal of the NMOS transistor NT2. Here, the intermediate signal line 77 formed on a field oxide film 76 connects the gate terminal of the NMOS transistor NT1 to the signal line 72 connected via a contact to the source terminal of the NMOS transistor NT3 in order to form the node N1.

The signal lines 81, 82, 83 and 84 are formed in the second layer L2. The interconnection signal line 81 connects a transmission line 91 of the second decoder signal DEC20 to the signal line 71 formed in the first layer L1 for connecting the source terminal of the NMOS transistor NT3. The interconnection signal line 82 connects a transmission line 92 of the gate boosting voltage GVPP to the gate terminal of the NMOS transistor NT3. The first decoder signal DEC10 is applied to the signal line 83. The interconnection signal line 84 connects a transmission line 93 of the second decoder signal DEC21 to the gate terminal of the NMOS transistor NT2.

The transmission lines 91, 92 and 93 are formed in the third layer L3. The transmission line 92 is to transmit the gate boosting voltage GVPP. The transmission lines 91 and 93 are to transmit the second decoder signals DEC20 and DEC21, respectively. References n+ show a source and drain of NMOS transistors.

Figure 22:
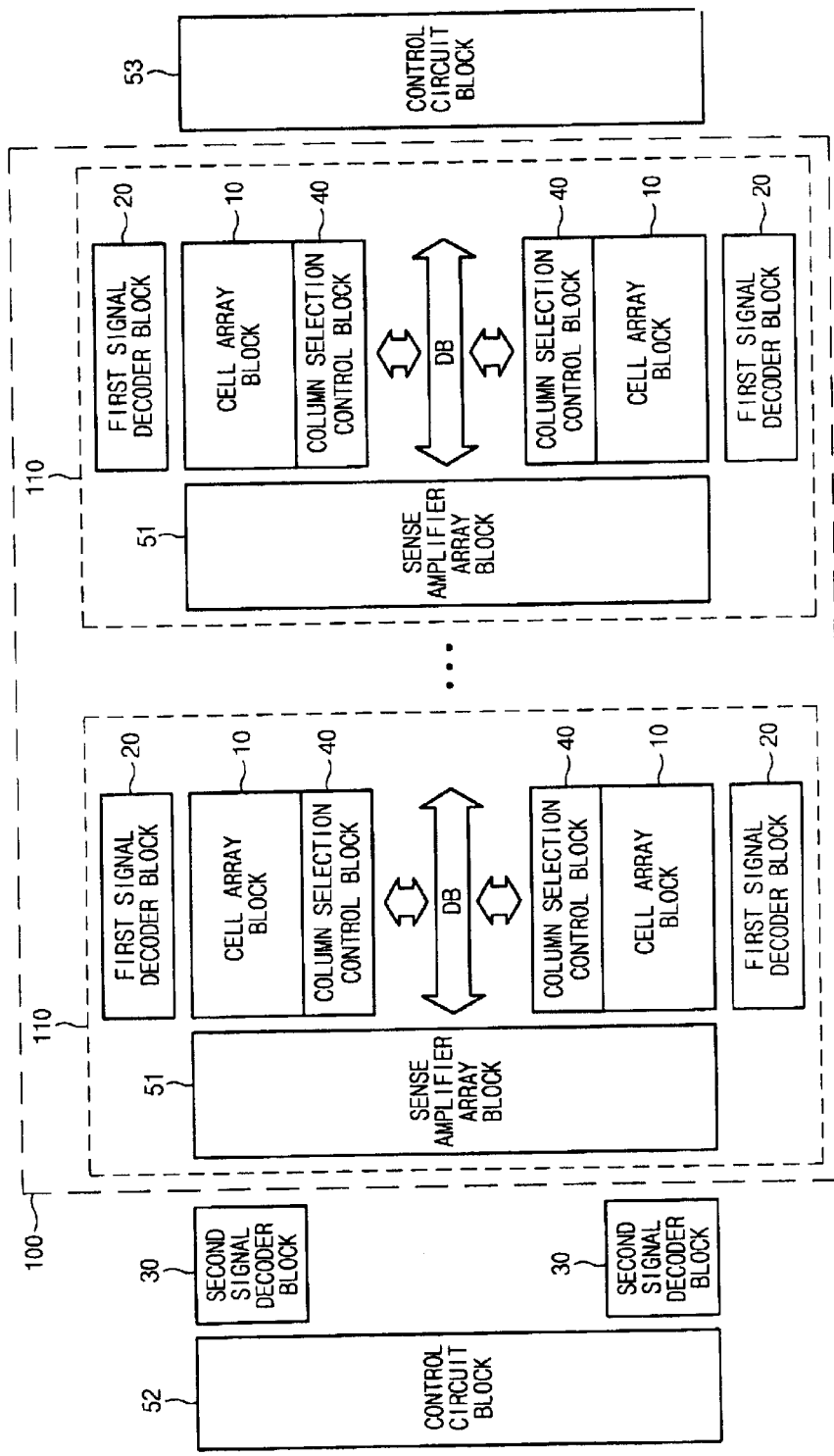
FIG. 22 is a block diagram illustrating another example of the disclosed nonvolatile ferroelectric memory device.

FIG. 22 is a block diagram illustrating another example of the disclosed nonvolatile ferroelectric memory device according to the present invention.

The nonvolatile ferroelectric memory device comprises a memory area 100, control circuit blocks 52 and 53, and a second signal decoder block 30.

The memory area 100 is disposed between the control blocks 52 and 53.

The second signal decoder block 30 is disposed between the control block 52 and the memory block 100.

The memory area 100 includes a plurality of memory blocks 110. The memory block 110 comprises two cell array blocks sharing one data bus DB, and a sense amplifier array 51.

A column selecting control block 40, a cell array block 10 and a first signal decoder block 20 are symmetrically arranged with respect to the data bus DB.

Here, the cell array blocks 10 located above the data bus DB share one second signal decoder block 30 while the cell array blocks 10 located below the data bus DB share the other second signal decoder block 30. The control circuit block 52 includes control circuits, buffers, decoders. The control circuit block 53 includes control circuits, buffers, decoders, input/output control.

Figure 23:
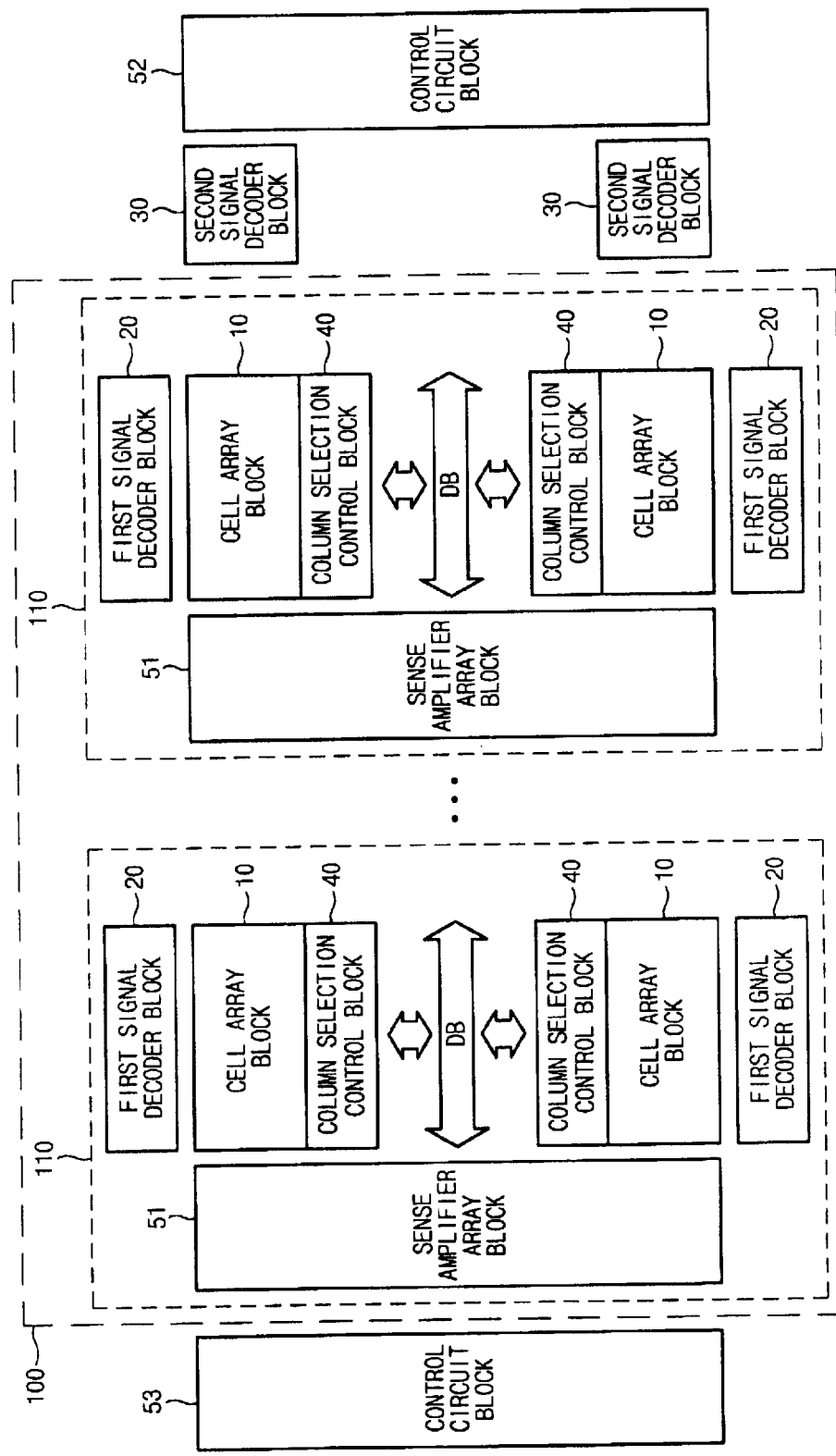
FIG. 23 is a block diagram illustrating still another example of the disclosed nonvolatile ferroelectric memory device.

FIG. 23 is a block diagram illustrating still another example of the disclosed nonvolatile ferroelectric memory device according to the present invention.

The nonvolatile ferroelectric memory device of FIG. 23 has the same structure as that of the nonvolatile ferroelectric memory device shown in FIG. 22. However, the second signal decoder block 30 is arranged outside the opposite side of the sense amplifier array 51 in the memory block 110.

The control circuit block 52 includes control circuits, buffers, decoders. The control circuit block 53 includes control circuits, buffers, decoders, input/output control circuits.

Figure 24:
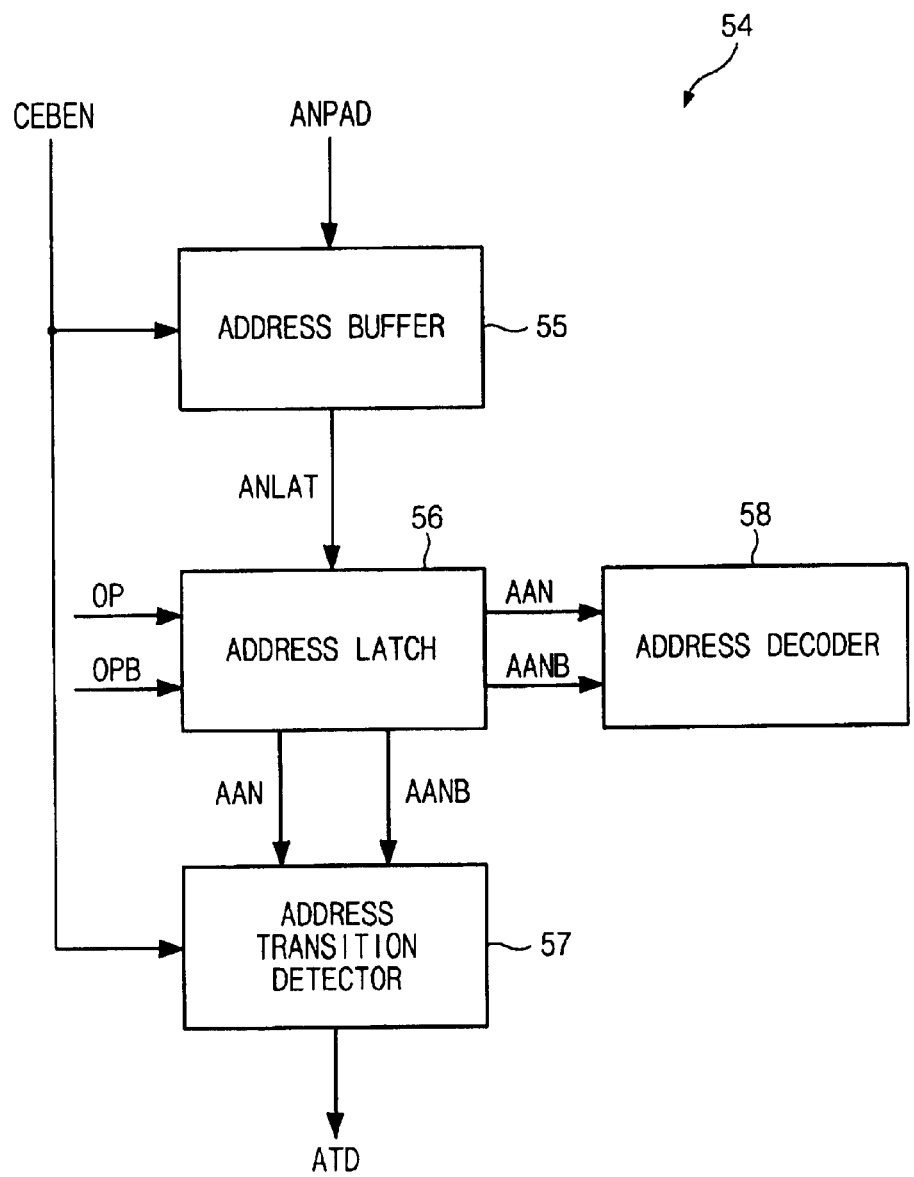
FIG. 24 is a block diagram illustrating an address transition detecting circuit in the control circuit block of the nonvolatile ferroelectric memory device.

FIG. 24 is a block diagram illustrating an address transition detecting circuit in the control circuit block of the nonvolatile ferroelectric memory device.

The address transition detecting circuit 54 comprises an address buffer 55 enabled by a clock enable signal CEBEN, an address latch 56, an address transition detector 57 enabled by the clock enable signal CEBEN, and an address decoder 58.

The address buffer 55 temporarily stores an address pad signal ANPAD inputted via an address pad, and then outputs an address latch signal ANLAT.

The address latch 56 latches an address latch signal ANLAT in response to operation control signals OP and OPB, and then outputs address signals AAN and AANB. The address transition detector 57 outputs an address transition detecting signal by using address signals AAN and AANB.

The address decoder 58 decodes the address signals AAN and AANB in order to selects a wordline and a column.

Figure 25:
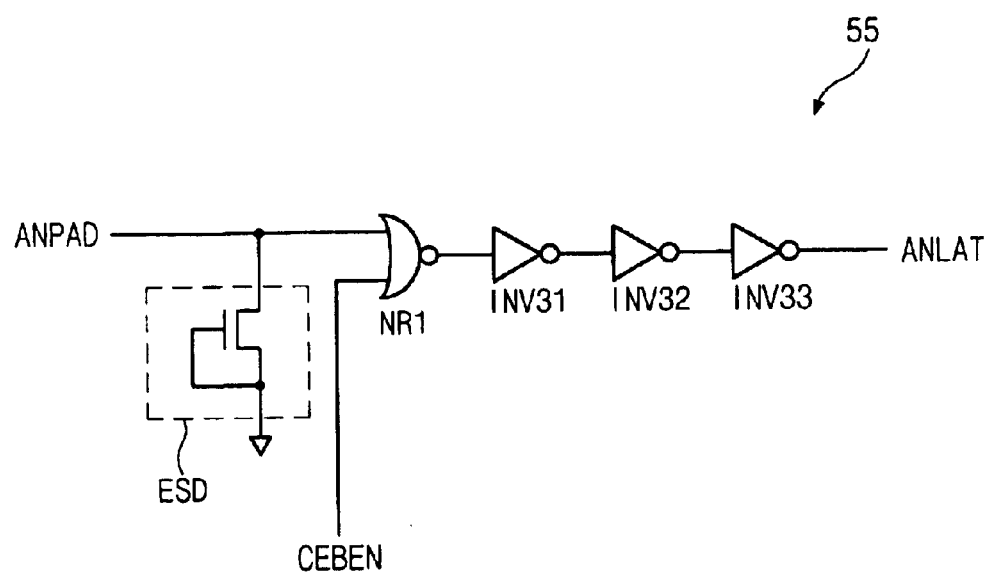
FIG. 25 is a circuit diagram illustrating an address buffer of FIG. 24.

FIG. 25 is a circuit diagram illustrating the address buffer 55 of FIG. 24.

The address buffer 55 comprises a NOR gate NR1, and inverters INV31, INV32 and INV33. The NOR gate NR1 NORs a clock enable signal CEBEN and the address pad signal ANPAD inputted via the address pad. The inverters INV31, INV32 and INV33 sequentially inverts an output signal from the NOR gate NR1.

Additionally, an ESD(Electro Static Discharge) device ESD comprising a diode-connected NMOS transistor is connected to the address pad.

Figure 26:
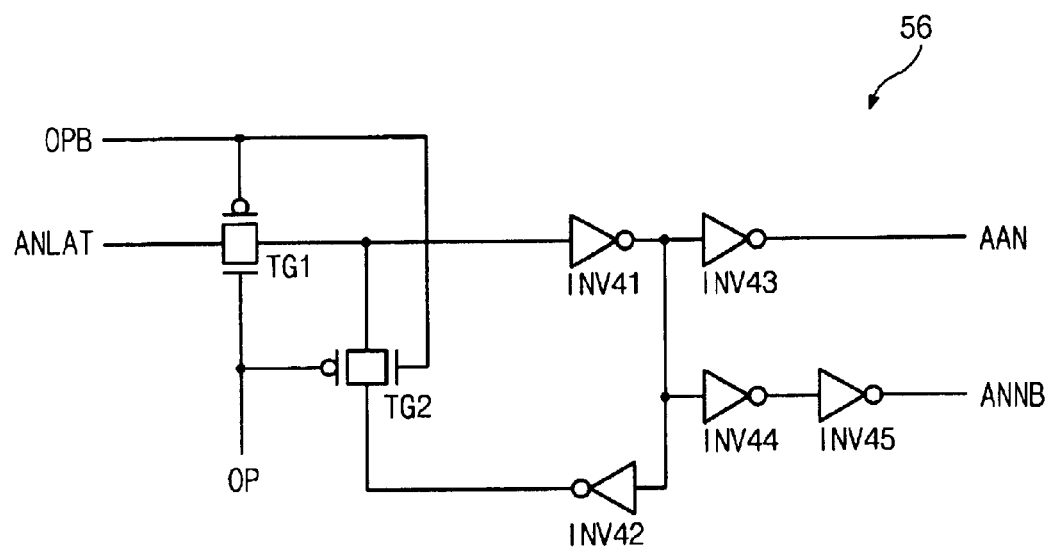
FIG. 26 is a circuit diagram illustrating an address latch of FIG. 24.

FIG. 26 is a circuit diagram illustrating an address latch 56 of FIG. 24.

The address latch 56 comprises transmission gates TG1 and TG2, and inverters INV41, INV42, INV43, INV44 and INV55. The transmission gate TG1 selectively transmits the address latch signal ANLAT in response to the operation control signals OP and OPB. The inverters INV41 and INV42 are latch-connected. The transmission gate TG2 selectively outputs an output signal from the inverter INV42 into an input terminal of the inverter INV41 in response to the operation control signals OP and OPB. The inverter INV43 inverts and output signal from the inverter INV41 to output the address signal AAN. The inverter INV44 and INV45 sequentially inverts the output signal from the inverter INV41, and then to output an inverted address signal AANB.

Figure 27:
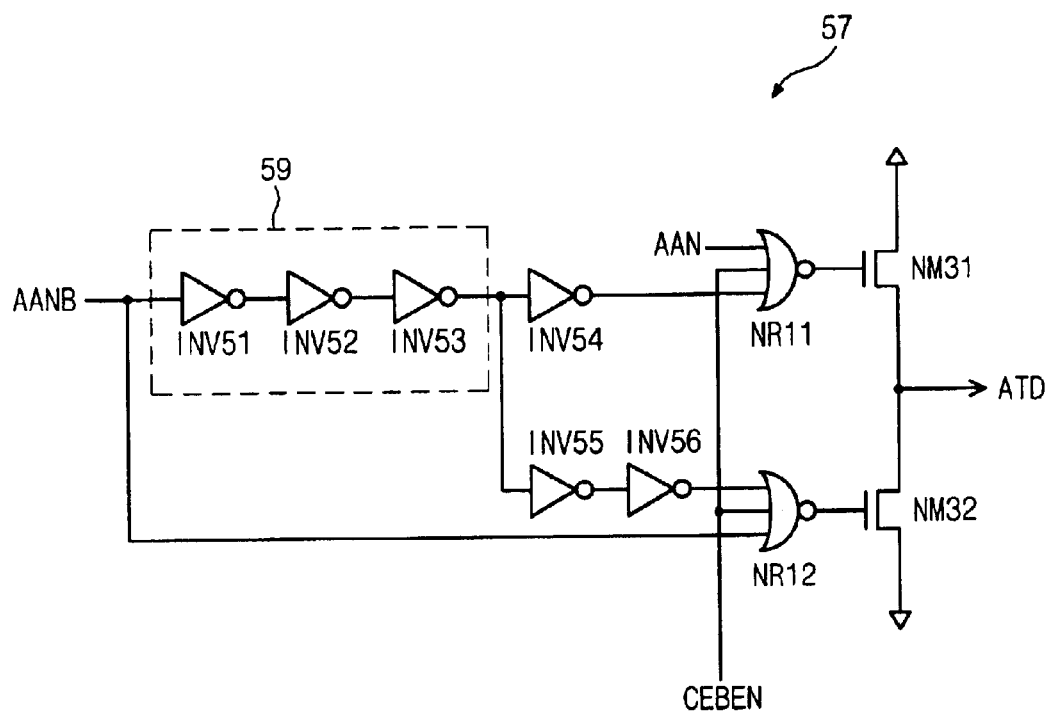
FIG. 27 is a circuit diagram illustrating an address transition detector of FIG. 24.

FIG. 27 is a circuit diagram illustrating an address transition detector 57 of FIG. 24.

The address transition detector 57 comprises a delay unit 59, inverters INV54, INV55 and INV 56, NOR gates NR11 and NR12, and NMOS transistors NM31 and NM32. The delay unit 59 including inverters INV51, INV52 and INV53 delays the inverted address signal AANB. The inverter INV54 inverts an output signal from the delay unit 59. The inverters INV55 and INV56 sequentially invert the output signal from the delay unit 59. The NOR gate NR11 NORs the address signal AAN, the clock enable signal CEBEN and an output signal from the inverter INV54. The NOR gate NR12 NORs the inverted address signal AANB, the clock enable signal CEBEN and an output signal from the inverter INV56. The NMOS transistors NM31 and NM32 pull down an address transition detecting signal line ATD in response to an output signal from the NOR gates NR11 and NR12.

Figure 28:
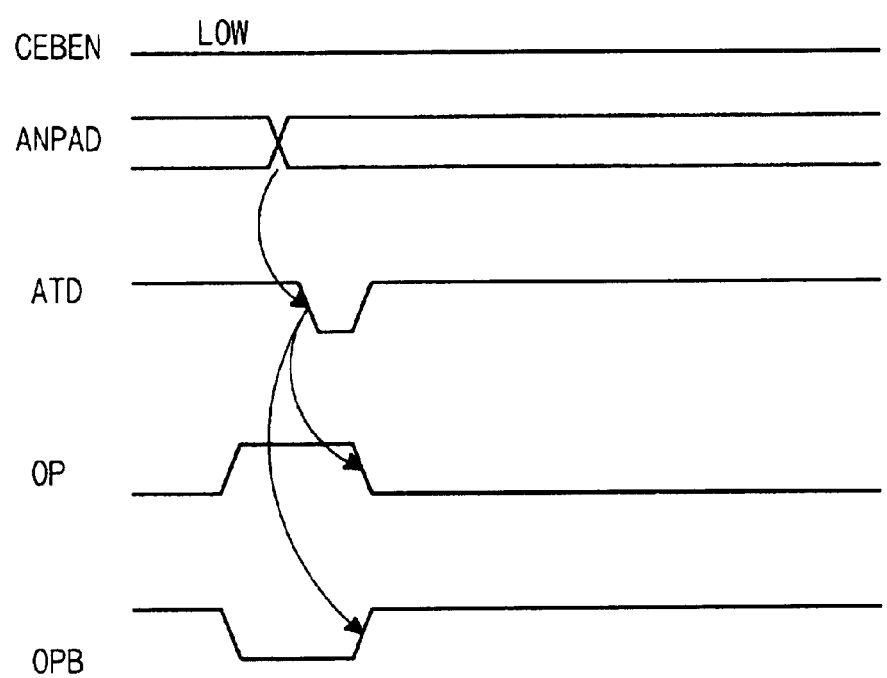
FIG. 28 is a timing diagram illustrating an operation of an address transition detecting circuit of FIG. 24.

FIG. 28 is a timing diagram illustrating an operation of an address transition detecting circuit of FIG. 24.

While the clock enable signal CEBEN is maintained at a low level, if the address pad signal ANPAD is changed, the address transition detecting signal ATD is generated as a pulse. As a result, the operation control signals OP and OPB are transited according to the pulse.

As discussed earlier, in the disclosed nonvolatile ferroelectric memory device, circuits related to wordline/plateline decoder blocks are divided into two areas, and arranged in different places. In other words, first and second signal decoder blocks disposed in different places. As a result, the disclosed nonvolatile ferroelectric memory device has an effect to reduce the area and improve the driving signal speed.

Since the number of wordline/plateline drivers is decreased, the area of wordline/plateline decoder can be reduced by arranging signal lines in different layers.

In addition, a since the wordline is activated earlier than the plateline, and the wordline is inactivated earlier than the plateline the state of the initial cell stroage node is stabilized in embodying multi-bit cells, thereby improving the sensing margin.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device comprising:
   a plurality of cell array blocks including a plurality of sub memory cell array blocks comprising a plurality of main bitlines and sub-bitlines connected to a plurality of memory cells;
   a plurality of drivers for selecting the plurality of memory cells, respectively; and
   a plurality of decoders connected to the cell array blocks, respectively, for applying decoding signals to the plurality of drivers,
   wherein the decoder comprises a first sub-decoder for generating the decoding signal applied to the driver and a second sub-decoder for generating a signal selecting the driver.

2. The device according to claim 1, further comprising a current regulator which sets a potential of the main bitline as a voltage of the data by a voltage of data in the sub-bitline.

3. The device according to claim 2, wherein the current regulator comprises a transistor having a control terminal connected to the sub-bitline, a terminal connected to the main bitline and another terminal connected to a ground voltage.

4. The device according to claim 1, further comprising a pull-up means to pull up the sub-bitline as a boosting voltage.

5. The device according to claim 4, wherein the pull-up means comprises a transistor having a control terminator to receive a pull-up control signal, a terminal to receive pull-up signal and another terminal connected to the sub-bitline.

6. The device according to claim 5, wherein the pull-up signal transits to a boosting voltage in a predetermined time after the pull-up control signal transits to a boosting voltage.

7. The device according to claim 1, further comprising a switch means to interconnect the sub-bitline and the main bitline in restore and write operations.

8. The device according to claim 7, wherein the switch means is controlled by a control signal enabled to a boosting voltage in restore and write operation.

9. The device according to claim 1, further comprising a plurality of load controllers for controlling the main bitline to have a predetermined load value.

10. The device according to claim 1, wherein the driver is formed in a region where buses of output signals from the first sub-decoder and that of output signals from the second sub-decoder cross.

11. The device according to claim 10, wherein each driver comprises:
    a first switch means for selectively transmitting a signal outputted from the first sub-decoder to a driving line in response to an output signal from the second decoder; and
    a second switch means for pulling down a driving line in response to another output signal from the second sub-decoder.

12. The device according to claim 11, wherein each driver further comprises a third switch device for selectively transmitting the signal outputted from the second sub-decoder into a control terminal of the first switch means in response to a gate control signal.

13. The device according to claim 12, wherein the gate control signal includes a short pulse having a boosting voltage level.

14. The device according to claim 12, wherein the first sub-decoder further comprises a means for generating the gate control signal.

15. The device according to claim 12, wherein the first sub-decoder further comprises a means for generating the gate control signal.

16. The device according to claim 10, wherein the driver has a hierarchical signal line structure.

17. The device according to claim 16, wherein the driver includes at least one intermediate connecting layer for transmitting a signal outputted from the second decoder.

18. The device according to claim 1, wherein the first sub-decoder includes a level shifter.

19. A nonvolatile ferroelectric memory device comprising:
    a plurality of unit memory blocks including one or more cell array blocks configured to include a plurality of main bitlines and sub-bitlines connected to a plurality of memory cells, and the plurality of unit memory blocks including a sense amplifier array blocks including a plurality of sense amplifiers;
    a plurality of drivers for selecting the memory cell of each cell array block; and
    a plurality of decoders connected to each unit memory block and for applying decoding signals to the plurality of drivers,
    wherein decoder comprises a first sub-decoder for generating the decoding signals applied to the driver, and a second sub-decoder for generating a signal for selecting the driver;
    wherein the plurality of unit memory blocks shares the second sub-decoder.

20. The device according to claim 19, wherein one or more of the cell array blocks share one sense amplifier array block.

21. A nonvolatile ferroelectric memory device comprising:
    a plurality of cell array blocks including a plurality of sub-memory cell array blocks comprising a plurality of main bitlines and sub-bitlines connected to a plurality of memory cells; and
    a control circuit block including an address control circuit for controlling a store operation and a read operation,
    wherein the address control circuit includes:
    an address buffer for buffering an address pad signal inputted through an address pad in response to a clock enable signal;
    an address latch for latching an output signal from the address buffer in response to an operation control signal; and
    an address transition detector for detecting a transition point of an output signal from the address latch in response to the clock enable signal.

22. The device according to claim 21, wherein the address buffer includes:
    a logic means for logically combining the address pad signal and the clock enable signal; and
    a buffering means for buffering an output signal from the logic means.

23. The device according to claim 22, wherein the address buffer further comprises an ESD circuit connected to an input terminal to receive the address pad signal.

24. The device according to claim 21, wherein the address latch comprises:
    a first transmitter for selectively transmitting an output signal from the address buffer in response to the operation control signal;
    a latch means for latching an output signal selectively transmitted from the first transmitter; and a second transmitter for selectively transmitting an output signal from the latch means into an input terminal of the latch means in response to the operation control signal.

25. The device according to claim 24, wherein the address transition detector includes:
  a delay means for delaying a signal outputted from the address latch for a predetermined time;
  a logic means for logically combining a signal outputted from the address latch and a signal outputted from the delay means in response to the clock enable signal; and
  a driver for outputting an address transition detecting signal configured to detect a transition point of a signal outputted from the address latch in response to a signal outputted from the logic means.

26. The device according to claim 25, wherein the driver includes a pull-down means for pulling down an address transition detecting signal in response to a signal outputted from the logic means.

* * * * *